US009691373B2

(12) United States Patent
Kano

(10) Patent No.: US 9,691,373 B2
(45) Date of Patent: Jun. 27, 2017

(54) NOISE CONTROLLER AND NOISE CONTROL METHOD FOR REDUCING NOISE FROM OUTSIDE OF SPACE

(71) Applicant: Panasonic Intellectual Property Management Co., Ltd., Osaka (JP)

(72) Inventor: Hiroyuki Kano, Hyogo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/852,355

(22) Filed: Sep. 11, 2015

(65) Prior Publication Data

US 2016/0093283 A1 Mar. 31, 2016

(30) Foreign Application Priority Data

Sep. 29, 2014 (JP) ................................ 2014-199073

(51) Int. Cl.

*H03B 29/00* (2006.01)
*G10K 11/178* (2006.01)
*G10L 21/0208* (2013.01)

(52) U.S. Cl.

CPC ...... *G10K 11/1786* (2013.01); *G10L 21/0208* (2013.01); *G10K 2210/1282* (2013.01);
(Continued)

(58) Field of Classification Search

CPC ...... H04R 2499/13; H04R 3/005; H04R 3/02; H04R 3/12; H04R 1/1083; H04R 3/002;
(Continued)

(56) References Cited

U.S. PATENT DOCUMENTS

| | | | | |
|---|---|---|---|---|
| 2008/0031468 A1* | 2/2008 | Christoph | .......... | G10K 11/1788 381/71.2 |
| 2010/0111317 A1 | 5/2010 | Asao et al. | | |

(Continued)

FOREIGN PATENT DOCUMENTS

| | | |
|---|---|---|
| JP | 5-061477 | 3/1993 |
| JP | 2000-322066 | 11/2000 |

OTHER PUBLICATIONS

The Extended European Search Report dated Feb. 19, 2016 for the related European Patent Application No. 15183576.6.

Felix Albu Et Al: "Pseudo-Affine Projection Algorithms for Multichannel Active Noise Control", IEEE Transactions on Audio, Speech and Language Processing, IEEE Service Center, New York, NY, USA, vol. 15, No. 3, Mar. 1, 2007 (Mar. 1, 2003), pp. 1044-1052.

Kuo S M Et Al: "Active Noise Control: A Tutorial Review", Proceedings of the IEEE, IEEE. New York, US, vol. 87, No. 6, Jun. 1, 1999 (Jun. 1, 1999), pp. 943-973.

(Continued)

*Primary Examiner* — Akelaw Teshale

(74) *Attorney, Agent, or Firm* — Greenblum & Bernstein, P.L.C.

(57) ABSTRACT

A noise controller includes a first control unit that outputs a control signal for outputting sound for reducing noise to a first speaker, a first characteristic circuit that generates a signal by performing convolution, using a transfer characteristic from the second speaker to a second sound collector, on a control signal output from the first control unit to a second speaker, a subtractor that subtracts the signal generated by the first characteristic circuit from an output signal of a second sound collector and outputs a resultant signal. The first control unit generates the control signal to be output to the first speaker while the output signal from the subtractor serves as a reference signal so that an output signal of the first sound collector is minimized, and outputs the control signal to the first speaker.

12 Claims, 18 Drawing Sheets

(52) U.S. Cl.
CPC ................ *G10K 2210/3018* (2013.01); *G10K 2210/3026* (2013.01); *G10K 2210/3046* (2013.01); *G10K 2210/3055* (2013.01)

(58) Field of Classification Search
CPC .. H04R 1/1008; H04R 1/406; H04R 2460/01; H04R 3/04; H04R 2410/05; H04R 2430/01; H04R 2430/03; H04R 25/407; H04R 25/453; H04R 25/554; H04R 25/558
USPC ........ 381/66, 112, 71.11, 71.4, 92, 95, 71.6, 381/71.1, 318, 57, 315, 317, 58, 71.2, 4, 381/10, 3, 104, 17, 23.1, 300, 56, 71.12, 381/71.8, 86
See application file for complete search history.

(56) References Cited

U.S. PATENT DOCUMENTS

| | | | | |
|---|---|---|---|---|
| 2010/0124337 | A1* | 5/2010 | Wertz ................ | G10K 11/1782<br>381/71.11 |
| 2015/0063581 | A1* | 3/2015 | Tani ..................... | G10K 11/178<br>381/71.2 |
| 2015/0356965 | A1* | 12/2015 | Tani ..................... | G10K 11/178<br>381/71.4 |

OTHER PUBLICATIONS

Harry F Olson Et Al: “Electronic Sound Absorber”, The Journal of the Acoustical Society of America, vol. 25, No. 6, Nov. 1, 1953 (Nov. 1, 1953), pp. 1130-1136.

* cited by examiner

CONTINUED TO FIG. 8B

NOISE CONTROLLER AND NOISE CONTROL METHOD FOR REDUCING NOISE FROM OUTSIDE OF SPACE

BACKGROUND

1. Technical Field

The present disclosure relates to a noise controller and a noise control method for reducing noise in a space where a plurality of seats are present, such as the interior of an automobile, when the noise comes from the outside of the space.

2. Description of the Related Art

Transportation, such as automobiles or aircrafts, sometimes makes users accumulate fatigue or stress caused by traveling noise.

Active noise control has been proposed in recent years as an effective measure against noise. For example, Japanese Unexamined Patent Application Publication No. 5-61477 discloses techniques for addressing engine sound of an automobile. Japanese Unexamined Patent Application Publication No. 2000-322066 discloses techniques for addressing low-frequency road noise with a frequency band of 20 to 150 Hz.

The above-mentioned techniques according to Japanese Unexamined Patent Application Publication No. 5-61477 and Japanese Unexamined Patent Application Publication No. 2000-322066 lack sufficient reduction effectiveness for noise with high randomness.

SUMMARY

One non-limiting and exemplary embodiment provides a noise controller capable of effectively reducing noise with high randomness.

In one general aspect, the techniques disclosed here feature a noise controller that reduces noise at a first seat and noise at a second seat, the noise controller including: a control unit that outputs a control signal to each of a first speaker and a second speaker, the control signal causing sound for reducing noise to be output; a convolution unit that generates a signal by performing convolution on the control signal output from the control unit to the second speaker using a transfer characteristic from the second speaker to a second sound collector; and a subtractor that subtracts the signal generated by the convolution unit from an output signal of the second sound collector and outputs a resultant signal, the first seat including: a first sound collector that collects the noise at the first seat; and the first speaker that outputs the sound for reducing the noise at the first seat, the second seat including: the second sound collector that collects the noise at the second seat; and the second speaker that outputs the sound for reducing the noise at the second seat, the control unit generating the control signal to be output to the first speaker while the signal output from the subtractor serves as a reference signal so that an output signal of the first sound collector is minimized, and outputting the control signal to the first speaker.

The noise controller according to the present disclosure can effectively reduce noise with high randomness.

It should be noted that general or specific embodiments may be implemented as a system, a method, an integrated circuit, a computer program, a recording medium, such as a computer-readable compact disc-read-only memory (CD-ROM), or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

[Underlying Knowledge Forming Basis of Present Disclosure]

The use of transportation, such as an automobile or an aircraft, for the purpose of business or travel is very convenient for users. However, the users of the transportation, such as an automobile or an aircraft, sometimes feel annoyed and accumulate fatigue or stress when lengthily subjected to traveling noise in a long-duration move.

Automobile manufacturers and airline companies have been reviewing how to offer comfortable spaces to passengers. Conventionally, techniques of passive sound insulation measures including increasing the sound insulation performance of a body panel are performed for example. However, such sound insulation measures are insufficient in the effectiveness of sound insulation for low-pitched sound (low-frequency noise) while reduction in the weight of a body is taken into account so as to enhance fuel efficiency. The noise that potentially makes users feel under stress is low-pitched sound rather than high-pitched sound, which can be reduced by the sound insulation measures. Thus, the measures against such low-frequency noise are regarded as important.

In recent years, the active noise control has been studied and developed as effective measures against the low-frequency noise. For example, the techniques for addressing engine sound of an automobile, such as those described in Japanese Unexamined Patent Application Publication No. 5-61477, are already in practical use.

However, the engine sound of an automobile is a mere part of noise within a wide frequency range that the traveling noise caused in the automobile has, and active noise control over many other kinds of noise including road noise and wind noise are not in practical use yet. As for the road noise with very low frequencies, there is an example of practical use as described in Japanese Unexamined Patent Application Publication No. 2000-322066.

Figure 1:
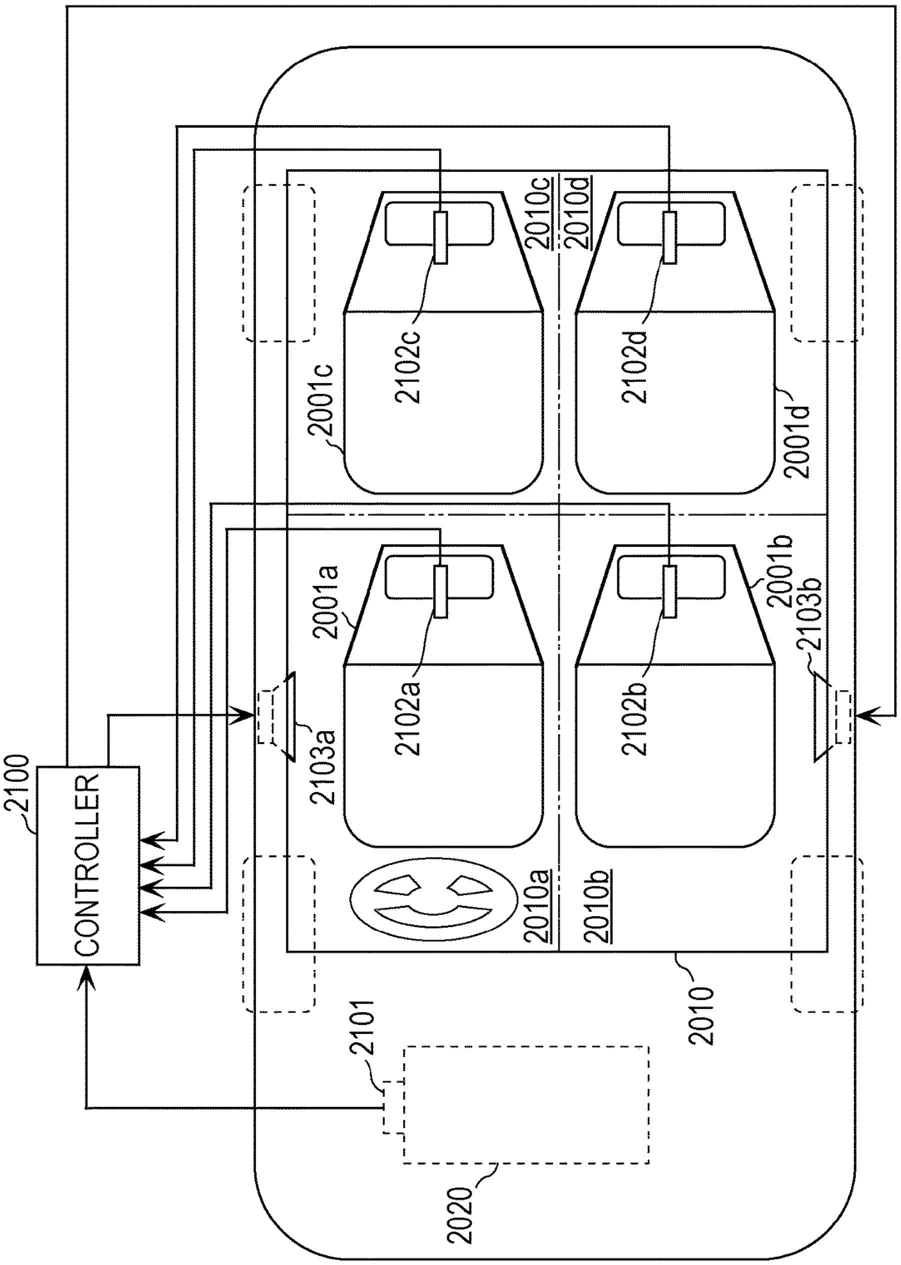
FIG. 1 PRIOR ART
FIG. 1 is a schematic diagram illustrating a top view of a vehicle interior for explaining an example of conventional active noise control.
Figure 2:
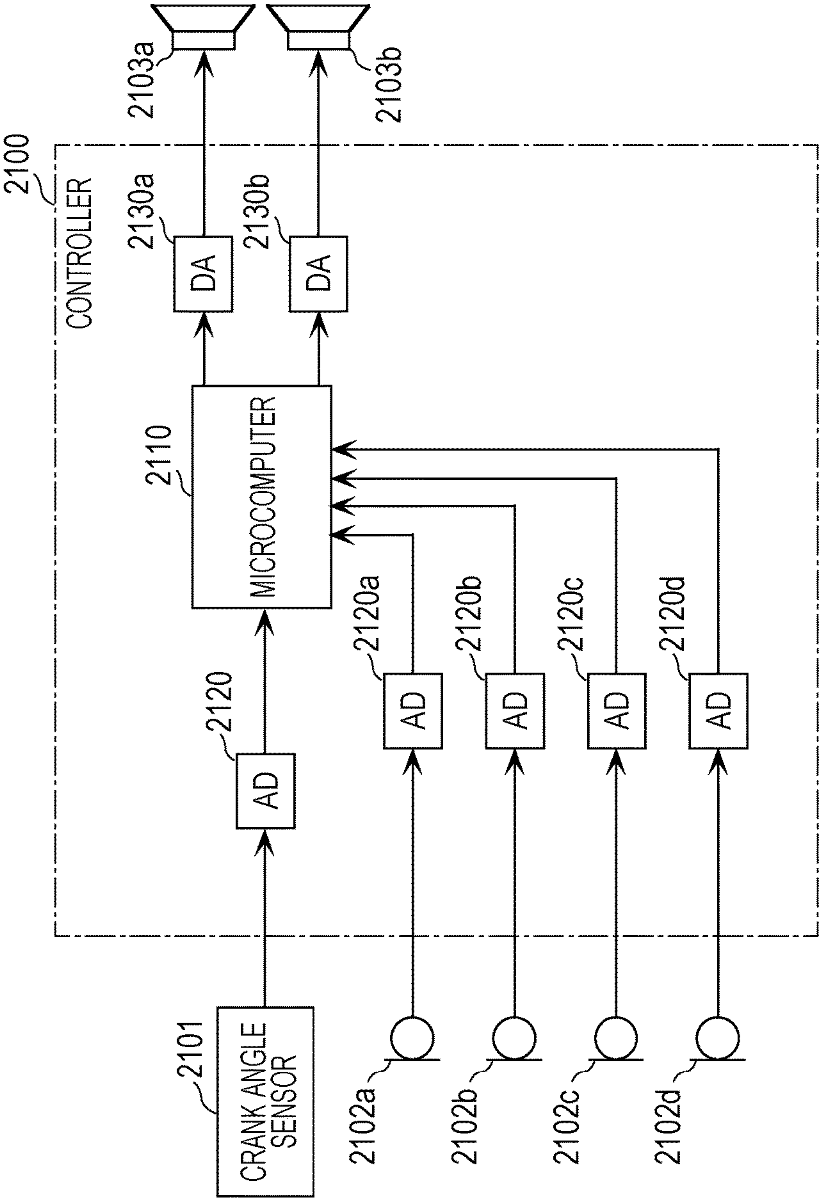
FIG. 2 PRIOR ART
FIG. 2 illustrates a structure that reduces engine sound of an automobile in the vehicle interior.

Now, the techniques disclosed in Japanese Unexamined Patent Application Publication No. 5-61477 are described as an example of conventional active noise control. FIG. 1 is a schematic diagram illustrating a top view of a vehicle interior 2010 for explaining the example of the conventional active noise control. FIG. 2 illustrates a structure that reduces the engine sound of an automobile in the vehicle interior.

It is assumed that the vehicle interior 2010 illustrated in FIG. 1 is divided into a front right side region 2010*a* including a seat 2001*a*, which is the driver seat, a front left side region 2010*b* including a seat 2001*b*, which is the passenger seat, a rear right side region 2010*c* including a seat 2001*c*, which is the rear seat on the driver seat side, and a rear left side region 2010*d* including a seat 2001*d*, which is the rear seat on the passenger seat side. Further, an engine 2020 is arranged on the front side of the vehicle as a noise source.

In the vehicle interior 2010, the door of the driver seat is provided with a speaker 2103*a* and the door on the passenger seat is provided with a speaker 2103*b*. Further, ceiling portions of the divided regions 2010*a* to 2010*d* are provided with error microphones 2102*a* to 2102*d*, respectively.

A crank angle sensor 2101 is attached to the engine 2020 and a crank angle detection signal is output from the crank angle sensor 2101 as a reference signal. Then, error signals output from the error microphones 2102*a* to 2102*d* are input to a controller 2100 and the crank angle detection signal of the crank angle sensor 2101 is also input to the controller 2100.

As illustrated in FIG. 2, the controller 2100 includes an analog-to-digital (AD) converter 2120, which performs AD conversion on the crank angle detection signal, AD converters 2120*a* to 2120*d*, which perform AD conversion on the error signals output from the error microphones 2102*a* to 2102*d*, a microcomputer 2110, to which the converted output signal of each AD converter is input, and digital-to-analog (DA) converters 2130*a* and 2130*b*, which perform DA conversion on drive signals for the speakers 2103*a* and 2103*b* output from the microcomputer 2110.

The microcomputer 2110 receives the crank angle detection signal from the AD converter 2120 and performs a signal process of a control coefficient in the microcomputer 2110 in accordance with the crank angle detection signal so as to reduce noise at the positions of the error microphones 2102*a* to 2102*d*. As a result of the signal process, the microcomputer 2110 outputs drive signals and the output drive signals are input to the speakers 2103*a* and 2103*b* via the DA converters 2130*a* and 2130*b*.

The speakers 2103*a* to 2103*b* replay drive sound based on the input drive signals after the DA conversion. The replayed drive sound and noise interfere with each other, and the error microphones 2102*a* to 2102*d* detect the interference results and output the detected interference results as the error signals.

The error signals are input to the microcomputer 2110 and the microcomputer 2110 uses an adaptive signal process to update the control coefficient so as to decrease the error signals. The control coefficient that minimizes the error signal is determined by repeating the set of the adaptive signal process. That is, the engine sound is reduced at the positions of the error microphones 2102*a* to 2102*d*. In other words, the engine sound is reduced in all of the divided regions 2010*a* to 2010*d* where the error microphones 2102*a* to 2102*d* are provided.

When the driver is an only occupant, it is unnecessary to control the passenger seat or the rear seats and thus, the gain of each error signal from the error microphones 2102*b* to 2102*d* provided in the regions other than the region of the driver seat is lowered so as to control only the front right side region 2010*a* that includes the seat 2001*a*, which is the driver seat. Then, in the adaptive signal process of the microcomputer 2110, the error signal detected at the error microphone 2002*a* in the front right side region 2010*a* is preferentially controlled. That is, engine sound reduction for the driver is performed more effectively.

As described above, it is explained in Japanese Unexamined Patent Application Publication No. 5-61477 that optimal engine sound reduction is possible for each seat in the vehicle interior 2010 since the ceiling portions of the respective seats are provided with the error microphones 2102*a* to 2102*d*. However, Japanese Unexamined Patent Application Publication No. 5-61477 lacks specific description regarding noise other than the engine sound. Although, as for the road noise for example, it is described that "the input of vibrations from the road surface to the wheels is detected", there is no specific indication regarding the detector used to detect the input of vibrations or the location where the detector is provided. Besides, although, as for the wind noise, it is described that the vibrations of window glass are detected, there is no description regarding a specific detection method.

Since the engine 2020 is present as the apparent noise source of the engine sound and the crank angle detection signal, which is a signal having very high correlation with the noise, can be surely detected by the crank angle sensor 2101, very effective control is possible.

However, it is difficult to identify the apparent noise source of the road noise since the vibrations from the road surface propagate all over the vehicle and the sound caused when any constituent element of the vehicle vibrates can be a new noise source. Due to the application of the vibrations from the road surface, the road noise enters an acoustic natural mode dependent on the size of the vehicle interior. That is, it is difficult to detect a vibration signal having high correlation with the road noise by referring to only the peripheries of the wheels.

The wind noise is caused not only at the windows but is also caused at all positions at which air touches the body of the traveling vehicle at high speed and has relatively high frequency components. Thus, it is more difficult to identify the noise source of the wind noise than the noise source of the road noise caused by the vibrations from the road surface, and detecting only the vibrations of the window glass is insufficient to detect a signal with high correlation.

Figure 3:
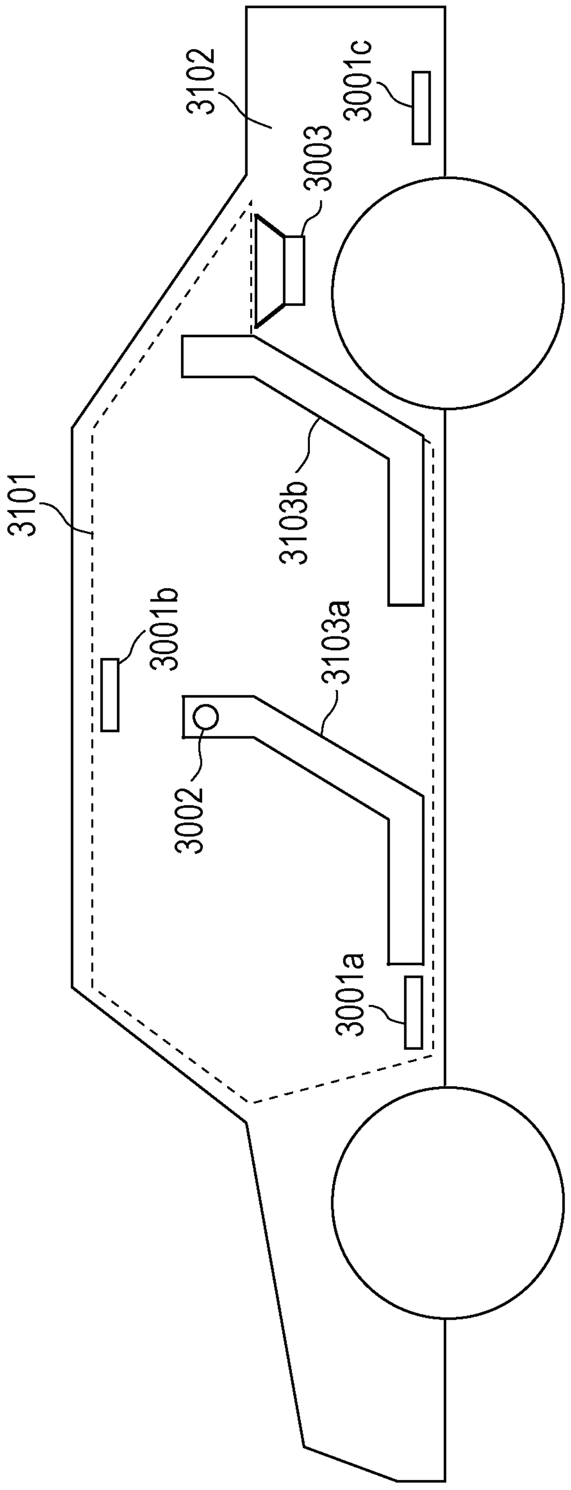
FIG. 3 PRIOR ART
FIG. 3 illustrates arrangement of noise detection microphones in a vehicle interior, which is used for the noise control according to Japanese Unexamined Patent Application Publication No. 2000-322066.
Figure 4:
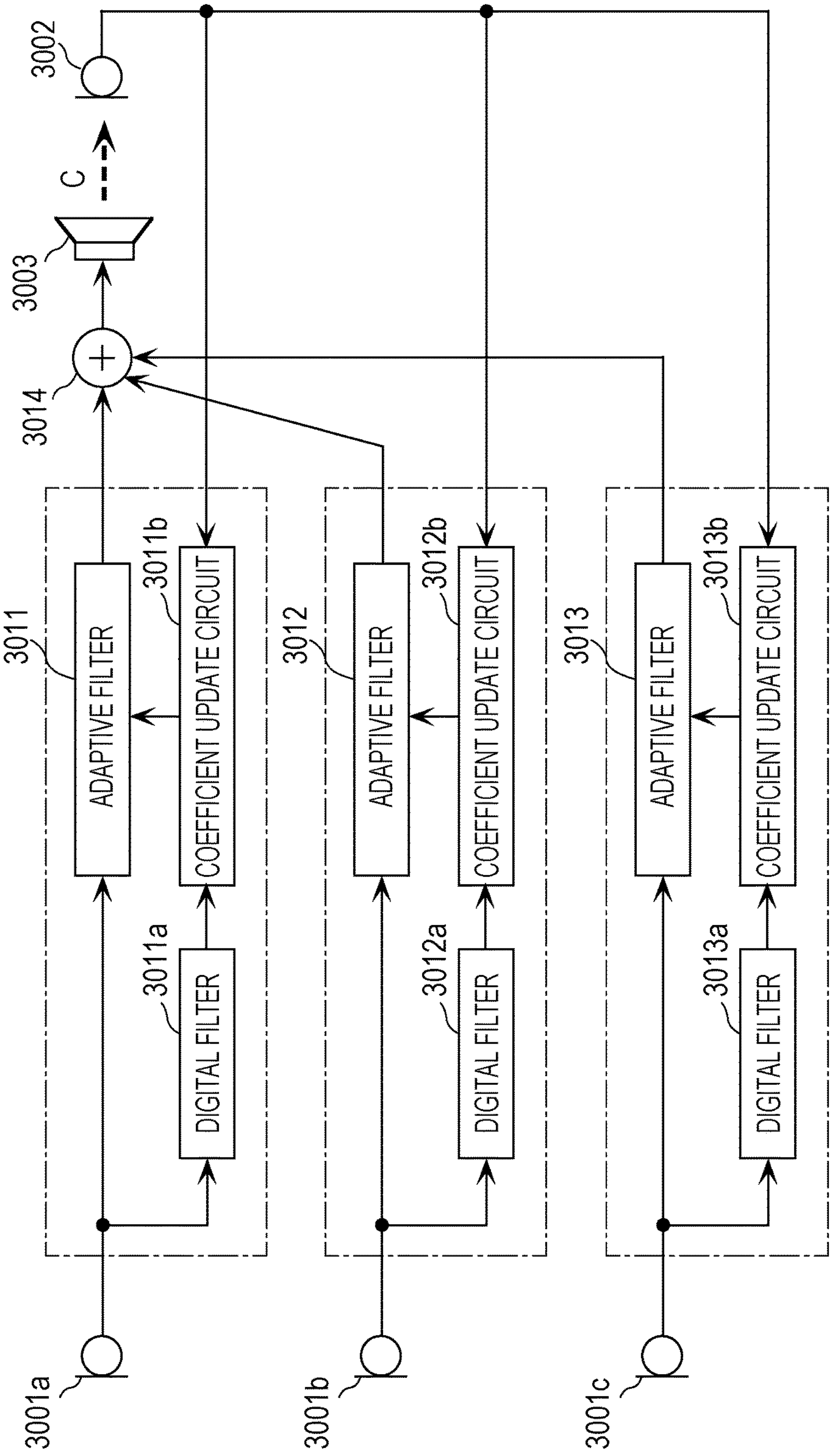
FIG. 4 PRIOR ART
FIG. 4 is a block diagram illustrating a functional structure of the noise reduction apparatus according to Japanese Unexamined Patent Application Publication No. 2000-322066.

Japanese Unexamined Patent Application Publication No. 2000-322066 provides an example of the control of the noise other than the engine sound. Japanese Unexamined Patent Application Publication No. 2000-322066 describes a specific example in which low-frequency road noise with a frequency band of 20 to 150 Hz is controlled as a target. FIG. 3 illustrates arrangement of the noise detection microphones in the vehicle interior, which are used for the noise control according to Japanese Unexamined Patent Application Publication No. 2000-322066. FIG. 4 is a block diagram illustrating a functional structure of the noise reduction apparatus according to Japanese Unexamined Patent Application Publication No. 2000-322066.

As illustrated in FIG. 3, a noise detection microphone 3001*a* is provided in a location near the feet of an occupant on a front seat, a noise detection microphone 3001*b* is provided near the center of a roof 3101, and a noise detection microphone 3001*c* is provided in a trunk room 3102. The noise detection microphones 3001*a* to 3001*c* are all provided in the portions corresponding to antinodes in a primary mode or a secondary mode of the acoustic natural mode of the vehicle interior.

When the vehicle is sized as a typical passenger automobile, the primary mode appears near 40 Hz and the secondary mode appears near 80 Hz. Since the primary mode or the secondary mode appears as noise of a large level also at front seats 3103*a* in the vehicle interior, which are the driver seat and the passenger seat, and rear seats 3103*b*, reduction is desired.

Since the acoustic natural mode has periodicity, high control effect can be expected if the noise detection is performed with reliability. The noise reduction apparatus according to Japanese Unexamined Patent Application Publication No. 2000-322066 detects noise components of for example, 40 Hz and 80 Hz, which are caused by the acoustic natural mode, with reliability since the noise detection microphones 3001*a* to 3001*c* are provided in the portions corresponding to the antinodes in the acoustic natural mode. The noise reduction apparatus according to Japanese Unexamined Patent Application Publication No. 2000-322066 performs coefficient update of adaptive filters 3011 to 3013 using the detection results so as to minimize a detection signal of an error microphone 3002 provided in for example, a headrest unit of the driver seat. Consequently, low-frequency road noise caused by the acoustic natural mode at the driver seat or any of the other seats can be reduced.

FIG. 4 is now referred to for the more detailed explanation. The transfer characteristics from a speaker 3003 to the error microphone 3002 are recorded in digital filters 3011*a*, 3012*a*, and 3013*a* as coefficients, and the coefficients are used in a convolution process for the noise signals from the noise detection microphones 3001*a* to 3001*c* and the resultant signals are input to respective coefficient update circuits 3011*b*, 3012*b*, and 3013*b*.

The coefficient update circuits 3011*b*, 3012*b*, and 3013*b* perform coefficient update of the adaptive filters 3011 to 3013 in accordance with the above-mentioned input signals and the error signal from the error microphone 3002 so that the error signal is decreased, that is, minimized. Typically, a least mean squares method (LMS) is used when the coefficient update circuits 3011*b*, 3012*b*, and 3013*b* perform the coefficient update. The digital filters 3011*a*, 3012*a*, and 3013*a* compensate for the transfer characteristics from the speaker 3003 to the error microphone 3002. The above-described structure is generally referred to as a filtered-x LMS.

Thus, Japanese Unexamined Patent Application Publication No. 2000-322066 includes specific description regarding a noise detection method and a control method for the low-frequency road noise, which are not described in Japanese Unexamined Patent Application Publication No. 5-61477, but lacks specific description regarding the road noise of 150 Hz or more and the wind noise. The characteristics of the acoustic natural mode of the road noise of 150 Hz or more increase in complexity and optimization of the placement position of the speaker becomes difficult while the randomness of the noise itself increases and no apparent noise source can be identified. That is, the disappearance of the apparent acoustic natural mode and the increase in randomness, or the decrease in correlation, are phenomena that are closely connected.

Accordingly, when reduction in the road noise of 150 Hz or more is attempted in addition to reduction in the low-frequency road noise of 150 Hz or less, the noise controller needs to detect noise that has high correlation with the noise detected at a control point, such as the position of the error microphone placed in the headrest of each seat.

In general, when the noise with high randomness undergoes noise detection of high correlation, it is satisfactory to perform the noise detection in a location as near the control point as possible. However, the locations in which noise microphones (noise detectors) that detect noise can be placed are restricted in practical use. For example, when it is inside an automobile, hanging and placing noise detectors in the air, or placing noise detector microphones on window glass is practically impossible since such placement may harm driving for example.

In view of the above, the present inventor has found techniques to place noise detectors at positions as near the control points as possible, which practically allow the noise detectors to be placed. According to the techniques, noise reduction is possible at a plurality of seats in the vehicle interior, and suppression of increase in costs due to the addition of a noise detector is also possible.

That is, the noise controller according to an aspect of the present disclosure reduces noise at a first seat and noise at a second seat, the noise controller including: a control unit that outputs a control signal to each of a first speaker and a second speaker, the control signal causing sound for reducing noise to be output; a convolution unit that generates a signal by performing convolution on the control signal output from the control unit to the second speaker using a transfer characteristic from the second speaker to a second sound collector; and a subtractor that subtracts the signal generated by the convolution unit from an output signal of the second sound collector and outputs a resultant signal, the first seat including: a first sound collector that collects the noise at the first seat; and the first speaker that outputs the sound for reducing the noise at the first seat, the second seat including: the second sound collector that collects the noise at the second seat; and the second speaker that outputs the sound for reducing the noise at the second seat, the control unit generating the control signal to be output to the first speaker while the signal output from the subtractor serves as a reference signal so that an output signal of the first sound collector is minimized, and outputting the control signal to the first speaker.

That is, in the above-described noise controller, the error microphone (the second sound collector) of the second seat is used as the noise detector of the first seat.

Thus, the above-described noise controller enables noise detection of high correlation. Specifically, the above-described noise controller can effectively reduce road noise of 150 Hz or less, road noise of 150 Hz or more, and noise with high randomness, such as wind noise with components of frequencies higher than the frequencies of the road noise. Since no extra placement of a noise detector is necessary, increase in costs caused by the addition of a noise detector can be suppressed.

A third sound collector that collects noise in a space including the first seat and the second seat may be provided around the first seat and the second seat, and the control unit may generate the control signal to be output to the first speaker while the third signal and an output signal from the third sound collector serve as reference signals so that the output signal of the first sound collector is minimized.

As described above, noise can be reduced more by further using the noise detector, which is the third sound collector.

The first sound collector, the first speaker, the second sound collector, and the second speaker may be further included.

Each of the first seat and the second seat may include a headrest, the first sound collector may be provided in the headrest of the first seat, and the second sound collector may be provided in the headrest of the second seat.

Each of the first seat and the second seat may include a headrest, the first speaker may be provided in the headrest of the first seat, and the second speaker may be provided in the headrest of the second seat.

A noise control method according to an aspect of the present disclosure reduces noise at a first seat and noise at a second seat, the first seat including a first sound collector that collects the noise at the first seat and a first speaker that outputs sound for reducing the noise at the first seat, the second seat including a second sound collector that collects the noise at the second seat and a second speaker that outputs sound for reducing the noise at the second seat, the noise control method includes: performing control to output a control signal to each of the first speaker and the second speaker, the control signal causing the sound for reducing the noise to be output; performing convolution, using a transfer characteristic from the second speaker to the second sound collector, on the control signal output to the second speaker in the control to generate a resultant signal; and performing subtraction to subtract the signal generated in the convolution from an output signal of the second sound collector to output a resultant signal, and in the control, the control signal to be output to the first speaker is generated while the signal output in the subtraction serves as a reference signal so that an output signal of the first sound collector is minimized, and is output to the first speaker.

It should be noted that general or specific embodiments may be implemented as a system, a method, an integrated circuit, a computer program, a recording medium, such as a computer-readable compact disc-read-only memory (CD-ROM), or any selective combination thereof.

Embodiments are described in detail below with reference to the drawings.

All of the embodiments described below provide general or specific examples. The values, shapes, materials, constituent elements, arrangement positions of the constituent elements, connection forms, steps, order of the steps, and the like that are indicated below in the embodiments are mere examples and are not intended to limit the present disclosure. Among the constituent elements of the embodiments below, the constituent elements that are not recited in independent claims indicating the most superordinate concepts can be explained as given constituent elements.

Embodiment 1

Embodiment 1 describes an example in which a noise controller is applied to an automobile.

[Structure]

Figure 5:
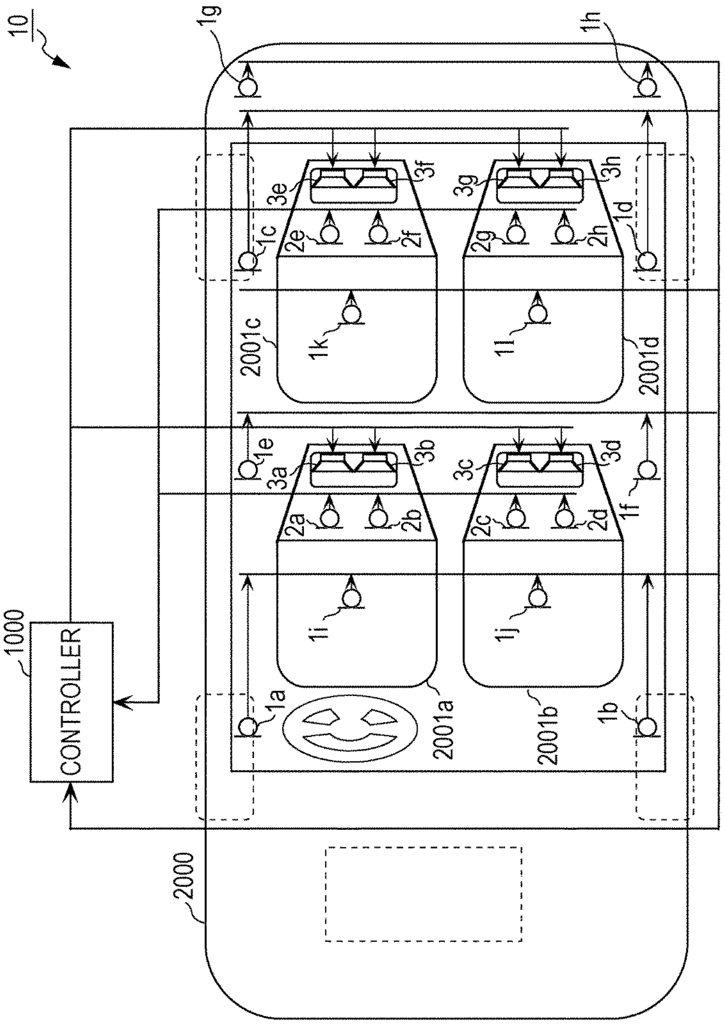
FIG. 5 illustrates an overall structure of the noise controller according to Embodiment 1.

A structure of a noise controller 10 according to Embodiment 1 is described first. FIG. 5 illustrates an overall structure of the noise controller 10 according to Embodiment 1. FIG. 5 is a schematic diagram illustrating a top view of the interior of an automobile 2000.

The noise controller 10 depicted in FIG. 5 causes control sound to be replayed from speakers 3*a* to 3*h* placed in the respective headrests of seats 2001*a* to 2001*d* two by two. Accordingly, the noise controller 10 reduces in-vehicle noise of the automobile 2000 at error microphones 2*a* to 2*h* that serve as control points.

The noise in the vehicle interior is detected by, for example, noise microphones 1*a* to 1*d*, which are placed near tires, and noise microphones 1*e* and 1*f*, which are placed in a location generally referred to as the B-pillar between the front seats and the rear seats. Further, the noise in the vehicle interior is detected by noise microphones 1*g* and 1*h*, which are placed in the trunk, and noise microphones 1*i* to 1*l* placed on the ceiling above the seats.

The noise detected (collected) by the above-described noise microphone is input to a controller 1000 as a noise signal. Then, a predetermined signal process is performed on the noise signal in the controller 1000 and as a result, the controller 1000 outputs control signals to speakers 3*a* to 3*h* and the speakers 3*a* to 3*h* output (replay) control sound based on the control signals.

The control sound from the speakers 3*a* to 3*h* and the noise interfere with each other at the respective positions (the control points) of the error microphones 2*a* to 2*h*, and the error microphones 2*a* to 2*h* detect the interference results and outputs the detected interference results as error signals to the controller 1000.

The controller 1000 generates control signals so as to minimize the error signals from the error microphones 2*a* to 2*h*. Accordingly, the noise is reduced at the positions of the error microphones 2*a* to 2*h*.

Figure 6:
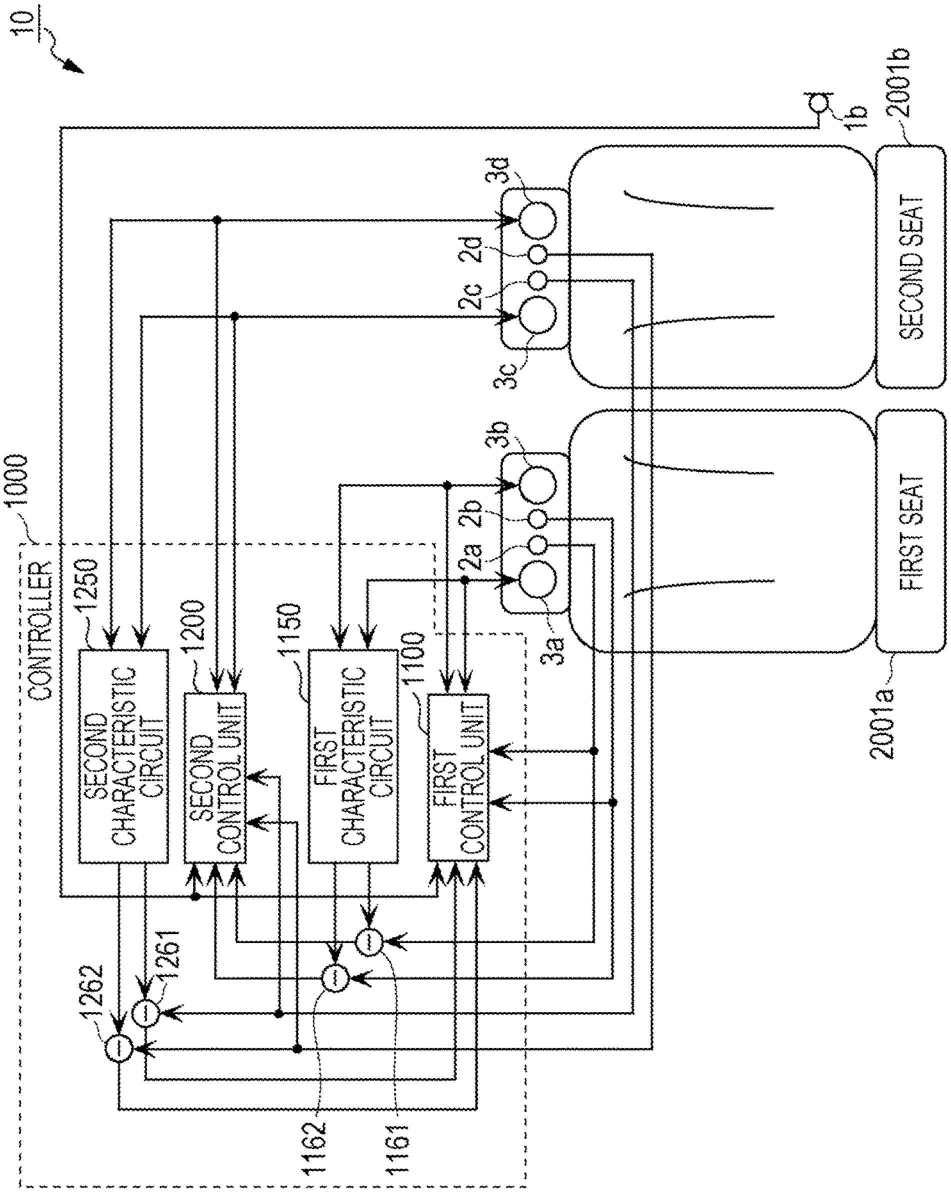
FIG. 6 is a diagram for explaining the functional structure of the noise controller according to Embodiment 1.

While the operations described above are similar to those in the conventional art, a feature of the present disclosure is that in generating a control signal for one seat, the error microphone of another seat is used as the noise microphone. The feature is described in detail below with reference to FIG. 6. FIG. 6 is a diagram for explaining the functional structure of the noise controller 10.

FIG. 6 depicts only the front seats in FIG. 5 for explanation, which are the first seat 2001*a* and the second seat 2001*b*, and illustrates only the structure necessary for the explanation. For example, as for the noise microphones, only the noise microphone 1*b* included in the noise microphones 1*a* to 1*l* is illustrated so as to simplify the explanation.

The noise controller 10 includes the noise microphone 1*b* as the noise detector, the error microphones 2*a* to 2*d* as the error detectors, the speakers 3*a* to 3*d*, and the controller 1000. The controller 1000 includes a first control unit 1100, a second control unit 1200, the first characteristic circuit 1150, a second characteristic circuit 1250, and subtractors 1161, 1162, 1261, and 1262.

The noise controller 10 is an apparatus for reducing noise at a plurality of seats including the first seat 2001*a* and the second seat 2001*b*. In Embodiment 1, the noise controller 10 reduces noise in the interior of the automobile 2000.

The first seat 2001*a* includes the error microphones 2*a* and 2*b*, which monitor noise at the first seat 2001*a*, and the speakers 3*a* and 3*b*, which output sound for reducing the noise at the first seat 2001*a*. The error microphones 2*a* and 2*b* are examples of the first sound collector and output electric signals dependent on the detection of the sound. The speakers 3*a* and 3*b* are examples of the first speaker.

The second seat 2001*b* includes the error microphones 2*c* and 2*d*, which monitor noise at the second seat 2001*b*, and the speakers 3*c* and 3*d*, which output sound for reducing the noise at the second seat 2001*b*. The error microphones 2*c* and 2*d* are examples of the second sound collector and output electric signals dependent on the detection of the sound. The speakers 3*c* and 3*d* are examples of the second speaker.

The noise microphone 1*b* is an example of the third sound collector provided around the first seat 2001*a* and the second seat 2001*b*. The noise microphone 1*b* collects noise in the space including the first seat 2001*a* and the second seat 2001*b*.

When the numbers of the speakers and the error microphones increase, the system may be extended to deal with the increase. Although in Embodiment 1, each seat is provided with two error microphones and two speakers, each seat may be provided with at least one error microphone and one speaker.

The first control unit 1100 outputs a control signal to the first speaker, that is, the speaker 3*a* or 3*b*, which causes the first speaker to output sound for reducing noise.

The second control unit 1200 outputs a control signal to the second speaker, that is, the speaker 3*c* or 3*d*.

The first control unit 1100 and the second control unit 1200 may be implemented as a single control unit and in this case, the single control unit outputs a control signal to each of the speakers 3*a* to 3*d*.

The first characteristic circuit 1150 generates a signal by performing convolution on the control signal output from the first control unit 1100 to the first speaker, which is the speaker 3*a* or 3*b*, with the transfer characteristic from the first speaker to the first sound collector, which is the error microphone 2*a* or 2*b*.

The second characteristic circuit 1250 generates a signal by performing convolution on the control signal output from the second control unit 1200 to the second speaker, which is the speaker 3*c* or 3*d*, with the transfer characteristic from the second speaker to the second sound collector, which is the error microphone 2*c* or 2*d*.

The first characteristic circuit 1150 and the second characteristic circuit 1250 are examples of the convolution unit.

The subtractor 1161 subtracts the signal generated by the first characteristic circuit 1150 from the output signal of the error microphone 2*a* and outputs the resultant signal. Similarly, the subtractor 1162 subtracts the signal generated by the first characteristic circuit 1150 from the output signal of the error microphone 2*b* and outputs the resultant signal.

The subtractor 1261 subtracts the signal generated by the second characteristic circuit 1250 from the output signal of the error microphone 2*c* and outputs the resultant signal. Similarly, the subtractor 1262 subtracts the signal generated by the second characteristic circuit 1250 from the output signal of the error microphone 2*d* and outputs the resultant signal.

According to the above-described structure, the first control unit 1100 and the second control unit 1200 can perform characteristic control as described below.

Specifically, the first control unit 1100 generates (updates) a control signal to be output to the first speaker, which is the speaker 3*a* or 3*b*, so that the output signal of the noise microphone 1*b* is minimized while the output signals from the subtractors 1261 and 1262 and the output signal of the first sound collector, which is the error microphone 2*a* or 2*b*, serve as reference signals, and the first control unit 1100 outputs the generated control signal to the first speaker.

Similarly, the second control unit 1200 generates (updates) a control signal to be output to the second speaker, which is the speaker 3*c* or 3*d*, so that the output signal of the noise microphone 1*b* is minimized while the output signals from the subtractors 1161 and 1162 and the output signal of the second sound collector, which is the error microphone 2*c* or 2*d*, serve as reference signals, and the second control unit 1200 outputs the generated control signal to the second speaker.

[Operations]

Figure 7:
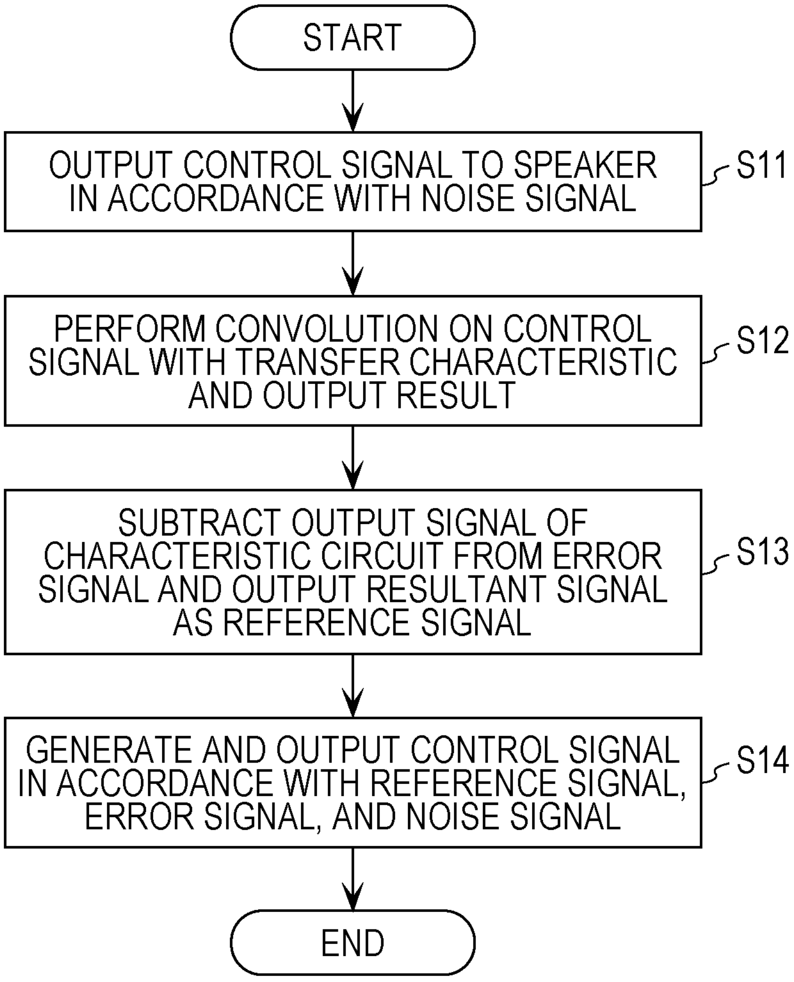
FIG. 7 is a diagram for explaining operations of the noise controller according to Embodiment 1.

Operations of the noise controller 10 thus structured are described below. FIG. 7 is a diagram for explaining the operations of the noise controller 10.

First, a noise signal that the noise microphone 1*b* outputs as a result of detecting noise is input to the first control unit 1100 and the second control unit 1200. A predetermined signal process is performed in the first control unit 1100 and the second control unit 1200 and consequently, the first control unit 1100 outputs control signals to the speakers 3*a* and 3*b* and the second control unit 1200 outputs control signals to speakers 3*c* and 3*d*. Thus, each of the speakers 3*a* to 3*d* outputs (replays) control sound (S11).

The headrests are provided with the error microphones 2*a* to 2*d* as well, and the error microphones 2*a* to 2*d* detect interference results between the noise and the control sound and output the detected results to the first control unit 1100 or the second control unit 1200 as error signals. The first control unit 1100 and the second control unit 1200 determine each control signal so that the error signals are minimized. The noise at the positions of the error microphones 2*a* to 2*d* is reduced by repeating this procedure. The operations so far are the same as the description using FIG. 5.

In the noise controller 10, further, the output signal (the detection signal) of each of the error microphones 2*a* to 2*d* is subtracted from the output signal of the first characteristic circuit 1150 or the output signal of the second characteristic circuit 1250 in corresponding one of the subtractors 1161, 1162, 1261, and 1262. The result of the subtraction is used as the noise signal of the second control unit 1200 or the noise signal of the first control unit 1100.

The transfer characteristic from the speaker 3*a* or 3*b* to the error microphone 2*a* or 2*b* is stored in the first characteristic circuit 1150. The first characteristic circuit 1150 performs convolution on the control signal of the first control unit 1100 with the transfer characteristic and outputs the result to the subtractors 1161 and 1162.

Similarly, the transfer characteristic from the speaker 3*c* or 3*d* to the error microphone 2*c* or 2*d* is stored in the second characteristic circuit 1250. The second characteristic circuit 1250 performs convolution on the control signal of the second control unit 1200 with the transfer characteristic and outputs the result to the subtractors 1261 and 1262 (S12).

When for example, the control signal to the speaker 3*a* undergoes convolution with the transfer characteristic from the speaker 3*a* to the error microphone 2*a*, components indicating the influence of the control sound output from the speaker 3*a* on the error microphone 2*a* are output from the first characteristic circuit 1150. Similarly, when the control signal to the speaker 3*b* undergoes convolution with the transfer characteristic from the speaker 3*b* to the error microphone 2*a*, components indicating the influence of the control sound output from the speaker 3*b* on the error microphone 2*a* are output from the first characteristic circuit 1150. Since the components are subtracted from the pure output signal of the error microphone 2*a*, only the components indicating noise, which are included in the output signal of the error microphone 2*a*, are output to the second control unit 1200.

That is, from the output signals from the error microphones 2*c* and 2*d*, which the first control unit 1100 uses as the noise signals, the redundant control signal of the second control unit 1200 (the influence of the control signal) is subtracted and only the noise signals from the error microphones 2*c* and 2*d* are left. Similarly, from the output signals from the error microphones 2*a* and 2*b*, which the second control unit 1200 uses as the noise signals, the redundant control signal of the first control unit 1100 (the influence of the control signal) is subtracted and only the noise signals from the error microphones 2*a* and 2*b* are left.

As described above, the first control unit 1100 can use the error microphones 2*c* and 2*d* of the second seat 2001*b* as the noise microphones, and the second control unit 1200 can use the error microphones 2*a* and 2*b* of the first seat 2001*a* as the noise microphones.

For example, the subtractor 1261 outputs a signal obtained by subtracting the output signal of the second characteristic circuit 1250 from the output signal of the error microphone 2*c* to the first control unit 1100 (S13). The first control unit 1100 generates and outputs a control signal so that the noise signal from the noise microphone 1*b* is minimized while the signals output from the subtractors 1261 and 1262 and the error signals from the error microphones 2*a* and 2*b* as reference signals (S14).

Figure 8A:
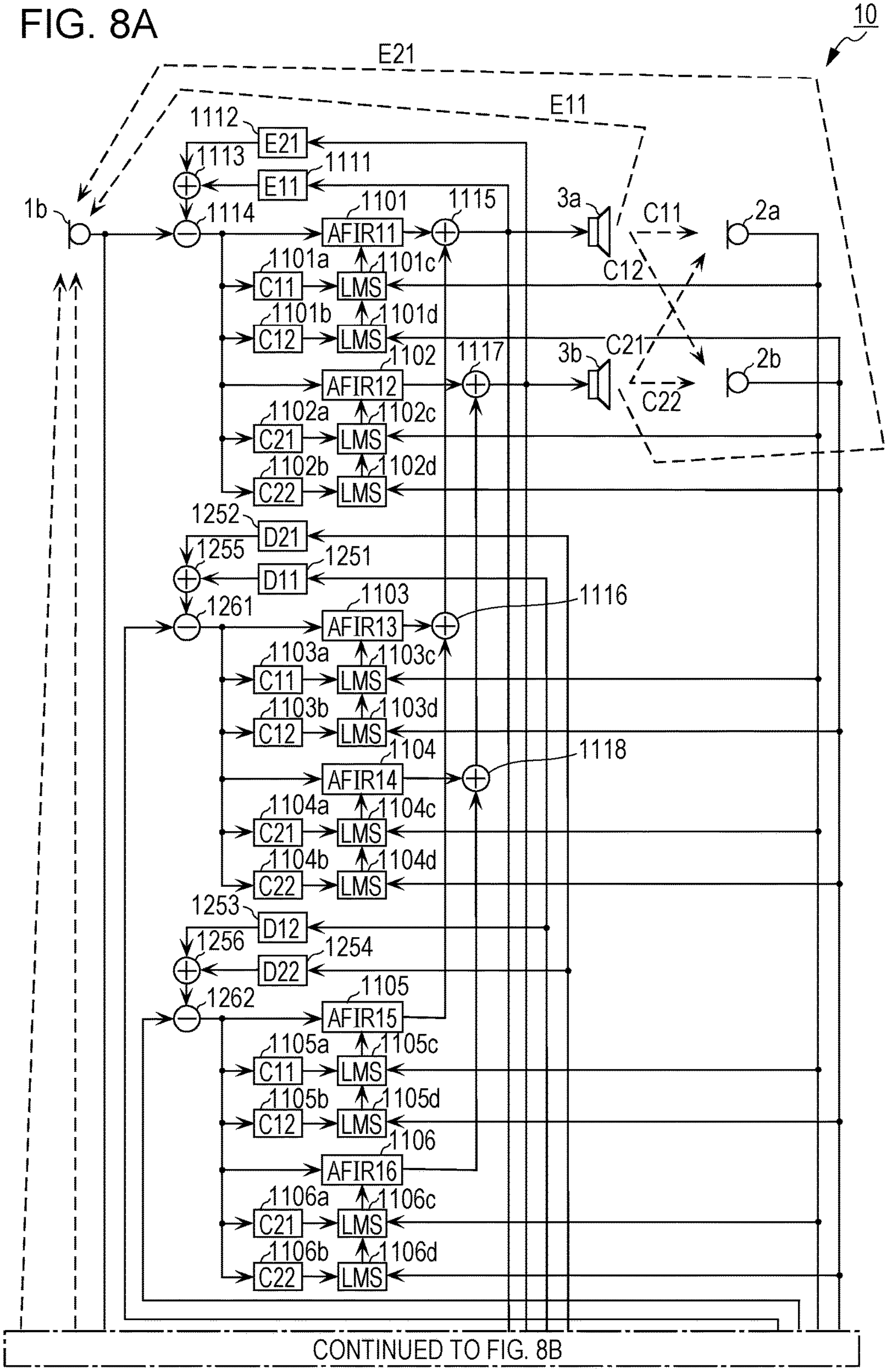
FIG. 8A is a first block diagram illustrating a detailed structure of the noise controller according to Embodiment 1.
Figure 8B:
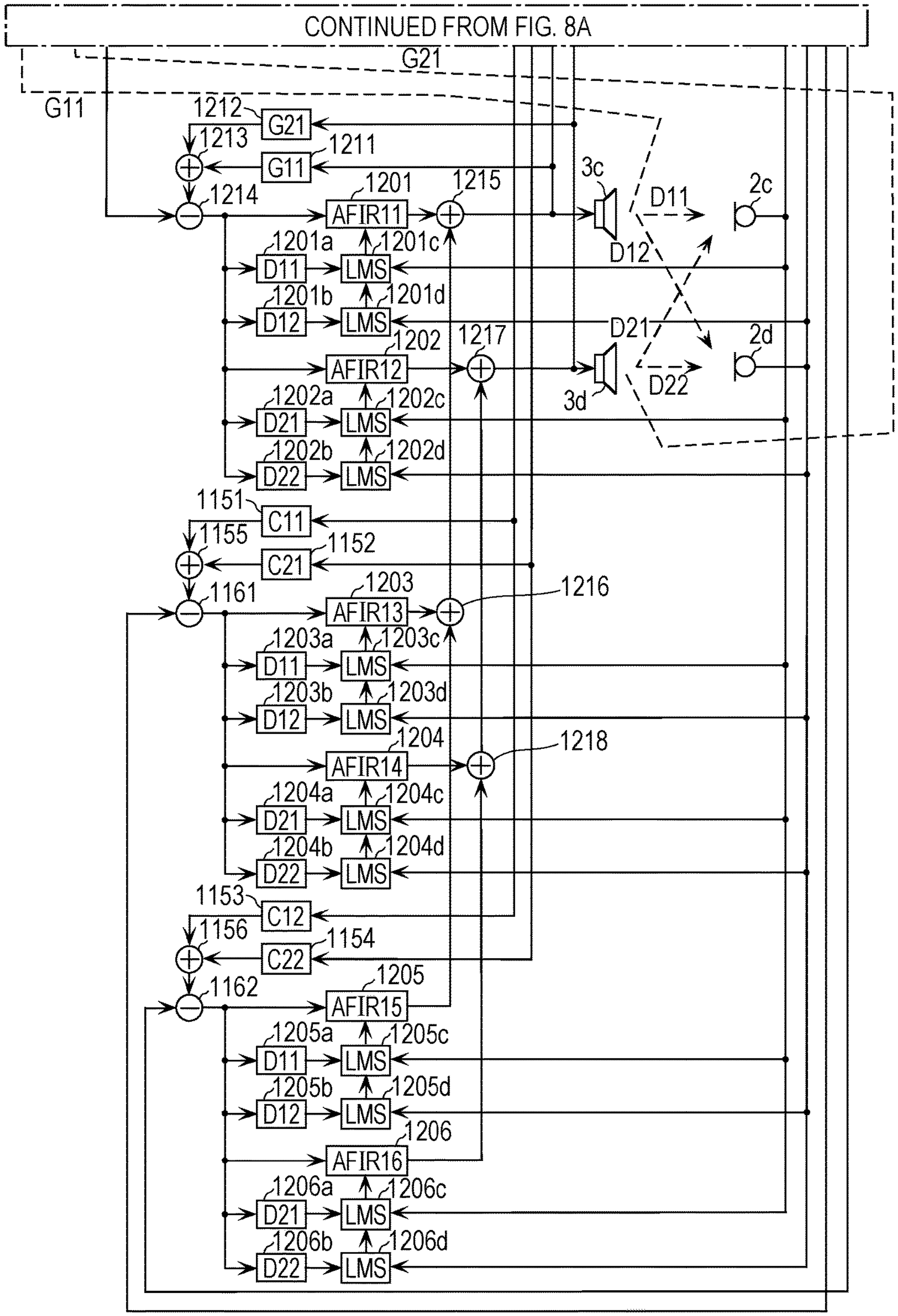
FIG. 8B is a second block diagram illustrating the detailed structure of the noise controller according to Embodiment 1.

The process above is described more specifically with reference to FIGS. 8A and 8B. FIGS. 8A and 8B are block diagrams, which illustrate a detailed structure of the noise controller 10. Characteristic circuits 1151 to 1154 in FIGS. 8A and 8B constitute the first characteristic circuit 1150 and characteristic circuits 1251 to 1254 constitute the second characteristic circuit 1250.

The control of the first seat 2001*a* is described below. The noise signal output from the noise microphone 1*b* is input to an adaptive filter 1101 via a subtractor 1114. The noise signal output from the noise microphone 1*b* undergoes a predetermined process in the adaptive filter 1101 and is input to an adder 1115.

The noise signal from the error microphone 2*c* provided in the second seat 2001*b* is input to an adaptive filter 1103 via the subtractor 1261. The noise signal output from the error microphone 2*c* undergoes a predetermined process in the adaptive filter 1103 and is input to an adder 1116. Similarly, the noise signal from the error microphone 2*d* provided in the second seat 2001*b* passes through the subtractor 1262 to undergo a predetermined process in an adaptive filter 1105 and is input to the adder 1116.

The adder 1116 adds the output signal from the adaptive filter 1103 and the output signal from the adaptive filter 1105, and outputs the resultant signal to the adder 1115. The adder 1115 adds the output signal of the adaptive filter 1101 and the output signal of the adder 1116, and control sound based on the resultant signal of the addition is output (replayed) from the speaker 3*a*.

Similarly, the noise signal output from the noise microphone 1*b* passes through the subtractor 1114 and is input to an adaptive filter 1102. The noise signal output from the noise microphone 1*b* undergoes a predetermined process in the adaptive filter 1102 and is input to an adder 1117.

The noise signal from the error microphone 2*c* provided in the second seat 2001*b* passes through the subtractor 1261 and is input to an adaptive filter 1104. The noise signal output from the error microphone 2*c* undergoes a predetermined process in the adaptive filter 1104 and is input to an adder 1118. Similarly, the noise signal from the error microphone 2*d* provided in the second seat 2001*b* passes through the subtractor 1262 to undergo a predetermined process in an adaptive filter 1106 and is input to the adder 1118.

The adder 1118 adds the output signal from the adaptive filter 1104 and the output signal from the adaptive filter 1106, and outputs the resultant signal to the adder 1117. The adder 1117 adds the output signal of the adaptive filter 1102 and the output signal of the adder 1118, and control sound based on the resultant signal of the addition is output (replayed) from the speaker 3*b*.

As described above, the control sound replayed by the speakers 3*a* and 3*b* interferes with noise and the error microphones 2*a* and 2*b* detect the residual sound as the error signals. The error signal from the error microphone 2*a* is output to LMS operators 1101*c*, 1102*c*, 1103*c*, 1104*c*, 1105*c*, and 1106*c*. The error signal from the error microphone 2*b* is output to LMS operators 1101*d*, 1102*d*, 1103*d*, 1104*d*, 1105*d*, and 1106*d*.

The noise signal from the noise microphone 1*b* passes through the subtractor 1114 to be input to Fx filters 1101*a*, 1101*b*, 1102*a*, and 1102*b*, and undergoes a convolution process using transfer characteristics C11, C12, C21, and C22 between the speaker 3*a* or 3*b* and the error microphone 2*a* or 2*b*, which are stored in the Fx filters 1101*a*, 1101*b*, 1102*a*, and 1102*b* as coefficients. The signals output from the Fx filters 1101*a*, 1101 *b*, 1102*a*, and 1102*b* are input to LMS operators 1101*c*, 1101*d*, 1102*c*, and 1102*d*, respectively. The LMS operators 1101*c*, 1101*d*, 1102*c*, and 1102*d* use the signals from the Fx filters 1101*a*, 1101*b*, 1102*a*, and 1102*b* and the error signal from the error microphone 2*a* or 2*b* to update the coefficients of the adaptive filters 1101 and 1102 so that each error signal is minimized.

The error signal from the error microphone 2*c* passes through the subtractor 1261 to be input to Fx filters 1103*a*, 1103*b*, 1104*a*, and 1104*b*, and undergoes a convolution process using the transfer characteristics C11, C12, C21, and C22 between the speaker 3*a* or 3*b* and the error microphone 2*a* or 2*b*, which are stored in the Fx filters 1103*a*, 1103*b*, 1104*a*, and 1104*b* as coefficients. The signals output from the Fx filters 1103*a*, 1103*b*, 1104*a*, and 1104*b* are input to the LMS operators 1103*c*, 1103*d*, 1104*c*, and 1104*d*. The LMS operators 1103*c*, 1103*d*, 1104*c*, and 1104*d* use the signals from the Fx filters 1103*a*, 1103*b*, 1104*a*, and 1104*b* and the error signal from the error microphone 2*a* or 2*b* to update the coefficients of the adaptive filters 1103 and 1104 so that each error signal is minimized.

A transfer characteristic D11 between the speaker 3*c* and the error microphone 2*c* is stored in the characteristic circuit 1251 as a coefficient and a transfer characteristic D21 between the speaker 3*d* and the error microphone 2*c* is stored in the characteristic circuit 1252 as a coefficient.

The control signals input to the speakers 3*c* and 3*d* undergo the convolution process of the coefficient D11 or D21 in the respective characteristic circuits 1251 and 1252. The outputs of the characteristic circuits 1251 and 1252 are added in an adder 1255 and then subtracted in the subtractor 1261 from the error signal from the error microphone 2*c*. Consequently, in the output signal of the subtractor 1261, the components of the control sound replayed by the speakers 3*c* and 3*d* are removed and only the components of the noise detected by the error microphone 2*c* are included. There is actually a case in which the removal is not performed completely.

Thus, the coefficients of the adaptive filters 1103 and 1104 are properly updated. That is, the influence of the control sound from the speakers 3*c* and 3*d* is reduced and the noise control of the first seat 2001*a*, which is based on the noise detected by the error microphone 2*c*, can be performed.

The error signal from the error microphone 2*d* is input to Fx filters 1105*a*, 1105*b*, 1106*a*, and 1106*b* via the subtractor 1262 and undergoes the convolution process using the transfer characteristics C11, C12, C21, and C22 between the speaker 3*a* or 3*b* and the error microphone 2*a* or 2*b*, which are stored in the Fx filters 1105*a*, 1105*b*, 1106*a*, and 1106*b* as the coefficients. The signals output from the Fx filters 1105*a*, 1105*b*, 1106*a*, and 1106*b* are input to the LMS operators 1105*c*, 1105*d*, 1106*c*, and 1106*d*. After that, the LMS operators 1105*c*, 1105*d*, 1106*c*, and 1106*d* use the signals from the Fx filters 1105*a*, 1105*b*, 1106*a*, and 1106*b* and the error signal from the error microphone 2*a* or 2*b* to update the coefficients of the adaptive filters 1105 and 1106 so that each error signal is minimized.

A transfer characteristic D12 between the speaker 3*c* and the error microphone 2*d* is stored in the characteristic circuit 1253 as a coefficient and a transfer characteristic D22 between the speaker 3*d* and the error microphone 2*d* is stored in the characteristic circuit 1254 as a coefficient.

The control signals input to the speakers 3*c* and 3*d* undergo the convolution process of the coefficient D12 or D22 in the respective characteristic circuits 1253 and 1254. The outputs of the characteristic circuits 1253 and 1254 are added in an adder 1256 and then subtracted in the subtractor 1262 from the error signal from the error microphone 2*d*. Consequently, in the output signal of the subtractor 1262, the components of the control sound replayed by the speakers 3*c* and 3*d* are removed and only the components of the noise detected by the error microphone 2*d* are included. There is actually a case in which the removal is not performed completely.

Thus, the coefficients of the adaptive filters 1105 and 1106 are properly updated. That is, the influence of the control sound from the speakers 3*c* and 3*d* is reduced and the noise control of the first seat 2001*a*, which is based on the noise detected by the error microphone 2*d*, can be performed.

While the noise control at the first seat 2001*a* is thus described, the noise control at the second seat 2001*b* is similar. The noise control at the second seat 2001*b* uses the noise detected by the noise microphone 1*b* and the noise detected by the error microphones 2*a* and 2*b*, and the influence of the control sound from the speakers 3*a* and 3*b* can be removed using the characteristic circuits 1151 to 1154.

[Advantages, Etc.]

The first seat 2001*a* and the second seat 2001*b* are positioned next to each other. That is, the error microphones 2*a* and 2*b* and the error microphones 2*c* and 2*d* are positioned in locations relatively close to each other, and the noise signal detected by each error microphone has high correlation. That is, in the noise control at the first seat 2001*a*, noise control using the noise signals that have high correlation with the error microphones 2*a* and 2*b* is enabled by utilizing the error microphones 2*c* and 2*d* of the second seat 2001*b* as the noise microphones. In such noise control, the reduction amount of the noise can be increased. The advantages of such noise reduction are described with reference to FIGS. 9 to 11.

Figure 9:
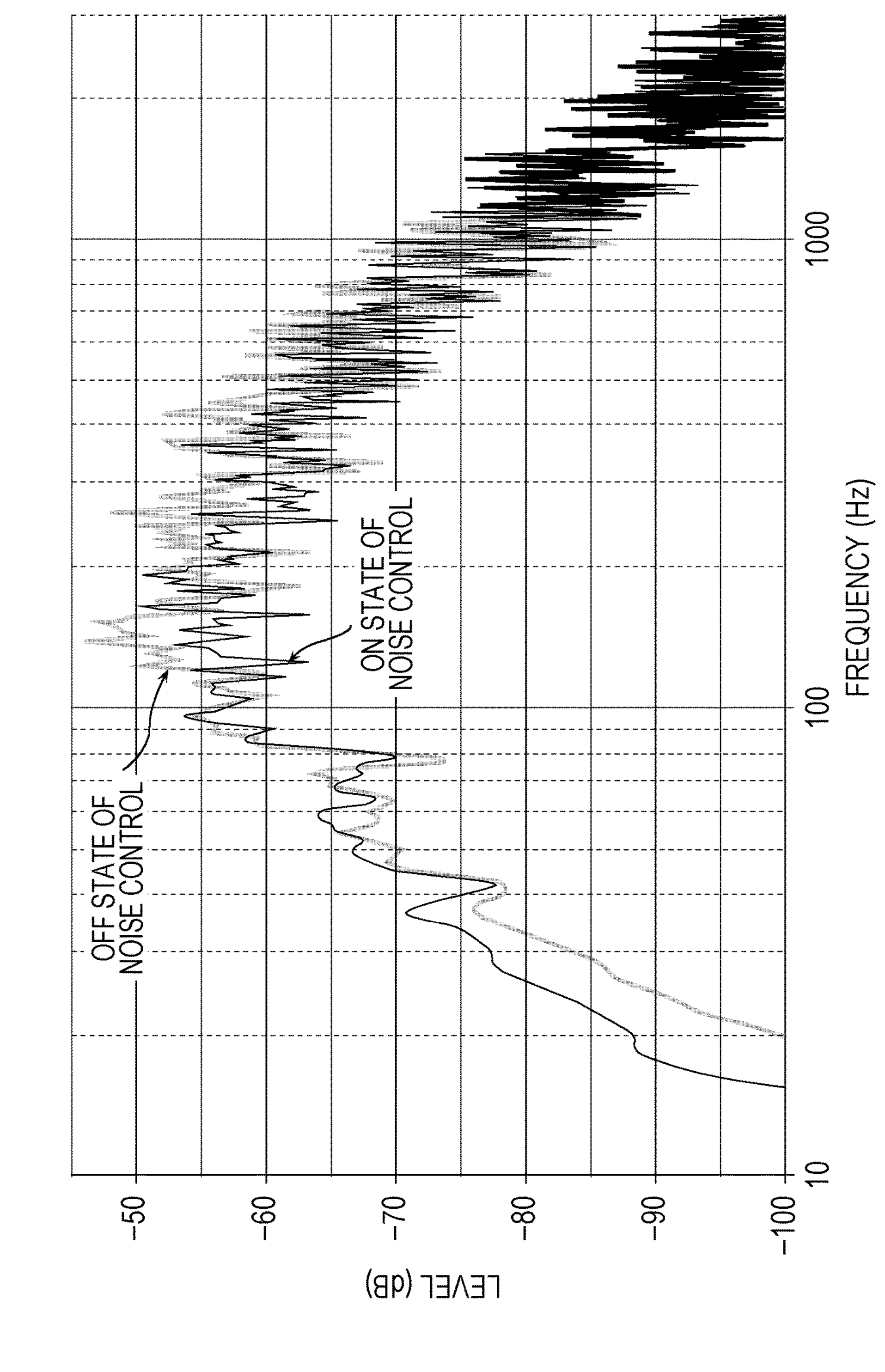
FIG. 9 PRIOR ART
FIG. 9 is a diagram illustrating comparison between the ON state and the OFF state of conventional noise control.
Figure 10:
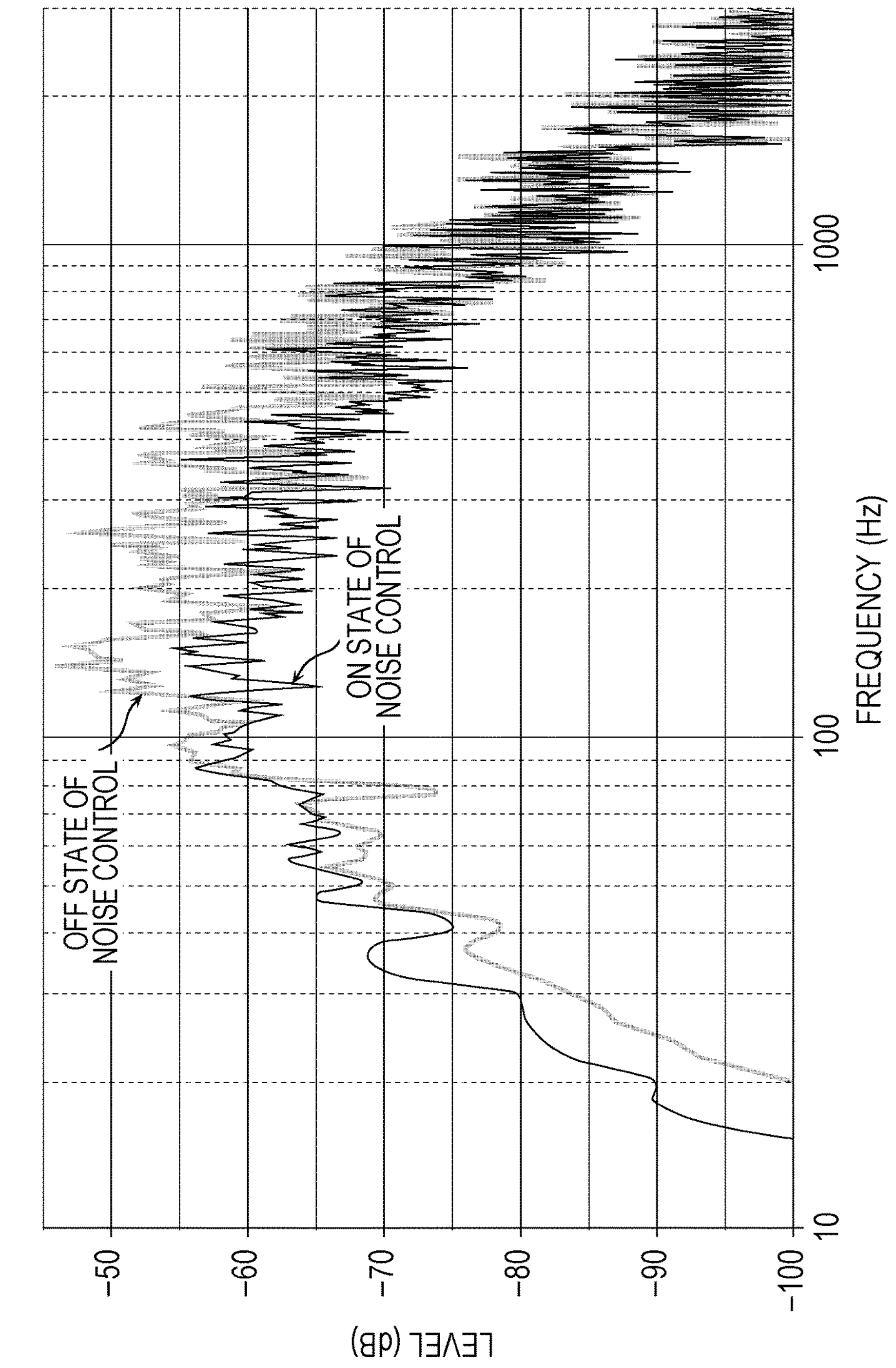
FIG. 10 is a diagram illustrating comparison between the ON state and the OFF state of the noise control by the noise controller according to Embodiment 1.
Figure 11:
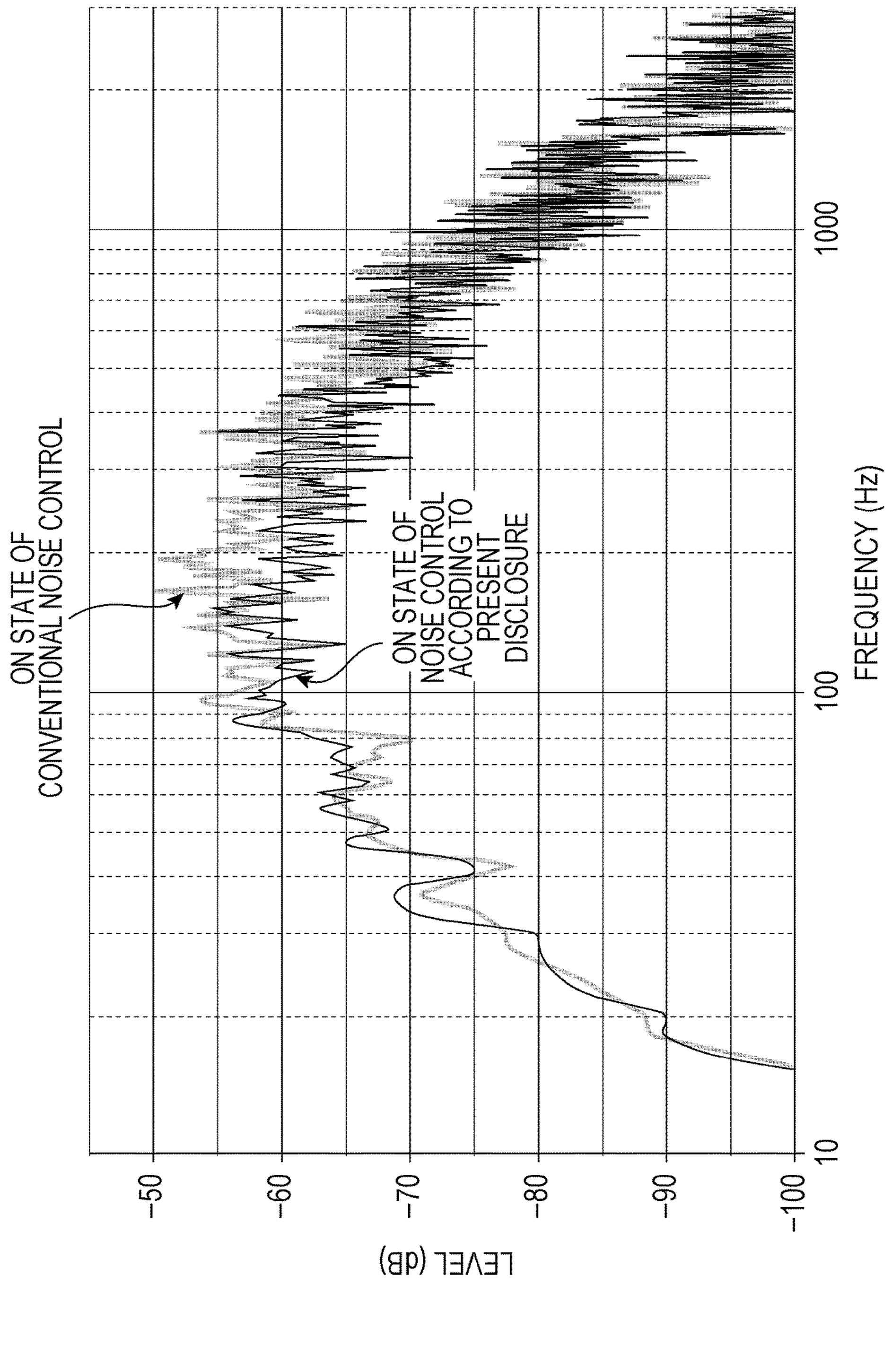
FIG. 11 is a diagram illustrating comparison between the ON state of the conventional noise control and the ON state of the noise control by the noise controller according to Embodiment 1.

FIG. 9 is a diagram illustrating comparison between the ON state and the OFF state of conventional noise control, and FIG. 10 is a diagram illustrating comparison between the ON state and the OFF state of the noise control by the noise controller 10. FIG. 11 is a diagram illustrating comparison between the ON state of the conventional noise control and the ON state of the noise control by the noise controller 10. Each illustration of FIGS. 9 to 11 is based on A-weighting.

The comparison between FIG. 9 and FIG. 10 demonstrates that the amount of the noise reduced by the noise controller 10 is large, which is indicated in FIG. 10. In addition, as illustrated in FIG. 11, in the noise control by the noise controller 10, the reduction effectiveness of the noise is enhanced for not only a low frequency band of 100 to 300 Hz but also a relatively high frequency band of 400 to 700 Hz. That is, according to the noise control by the noise controller 10, the amount of the reduction of the low-frequency noise can be increased and in addition, the amount of the reduction of the midrange-frequency noise and the high-frequency noise, which are difficult to be reduced by conventional methods, can also be increased.

As for tires, which have relatively apparent noise sources, sufficient reduction effectiveness for the road noise caused by the tires can be expected even in the conventional noise control by placing the noise microphones 1*a* to 1*d* near the tires. However, since the road noise includes many components unclear as noise sources as described above, it is desirable to obtain a signal that has high correlation through the noise detection near the error microphones, which are the control points, as performed in the noise controller 10. That is, the noise controller 10 is suitable for the control of noise with high randomness, whose source is not apparent.

Since in Embodiment 1, the error microphones already provided are used and no addition of a new microphone is necessary for the implementation, practical utility is high. Such noise control can be achieved without newly adding any of a microphone amplifier, a low-pass filter (LPF), which removes undesired high-frequency components, a circuit such as an AD converter for conversion into digital data, and the like, which are not illustrated, by utilizing the microphones already provided. That is, the noise controller 10 is advantageous also in terms of downsizing, cost reduction, etc. of the apparatus.

[Variation 1]

When the control sound replayed by the speakers 3*a* to 3*d* to the noise microphone 1*b* causes acoustic feedback, the influence of the acoustic feedback needs to be removed. In this case, acoustic feedback cancellers 1111, 1112, 1211, and 1212 illustrated in FIGS. 8A and 8B are used.

A transfer characteristic E11 from the speaker 3*a* to the noise microphone 1*b* is stored in the acoustic feedback canceller 1111 as a coefficient and a transfer characteristic E21 from the speaker 3*b* to the noise microphone 1*b* is stored in the acoustic feedback canceller 1112 as a coefficient.

The acoustic feedback canceller 1111 performs a convolution process of the coefficient E11 on the control signal for the speaker 3*a* and the acoustic feedback canceller 1112 performs a convolution process of the coefficient E21. The outputs of the acoustic feedback cancellers 1111 and 1112 are added in an adder 1113 and then subtracted from the noise signal from the noise microphone 1*b* in the subtractor 1114. Thus, the acoustic feedback from the speakers 3*a* and 3*b* to the noise microphone 1*b* can be removed.

When the acoustic feedback from the speakers 3*c* and 3*d* to the noise microphone 1*b* is removed at the second seat 2001*b*, the acoustic feedback cancellers 1211 and 1212 are used.

Since the noise microphone 1*b* is attached near the tire on the side of the passenger seat, the noise microphone 1*b* is positioned away from the speakers 3*a* to 3*d* provided in the headrest and the amount of the acoustic feedback is small. Thus, no acoustic feedback canceller is needed. However, since the noise microphones 1*e* to 1*f* placed in the B-pillar and the noise microphones 1*i* to 1*j* placed on the ceiling are relatively close to the speakers 3*a* to 3*d*, the acoustic feedback cannot be ignored. Thus, when the detection is performed with the noise microphones placed in such locations, it is desirable to use the acoustic feedback cancellers 1111, 1112, 1211, and 1212.

[Variation 2]

The embodiment above describes an example in which the error microphone of the adjacent seat, which is the second seat 2001*b*, is used as the noise microphone of a controlled seat, which is the first seat 2001*a*. For example, the error microphone of the seat in front of or behind the controlled seat may be used as the noise microphone. That is, the error microphone of the seat other than the controlled seat, which is one of the other seats that surround the controlled seat and also referred to as the different seat, is usable as the noise microphone in the noise control for the controlled seat.

Thus, every noise that arrives at the controlled seat from various directions can be detected and the correlation of the noise signal with respect to the error microphone of the controlled seat can be increased as a whole and accordingly, the noise reduction effectiveness can be further enhanced.

Figure 12:
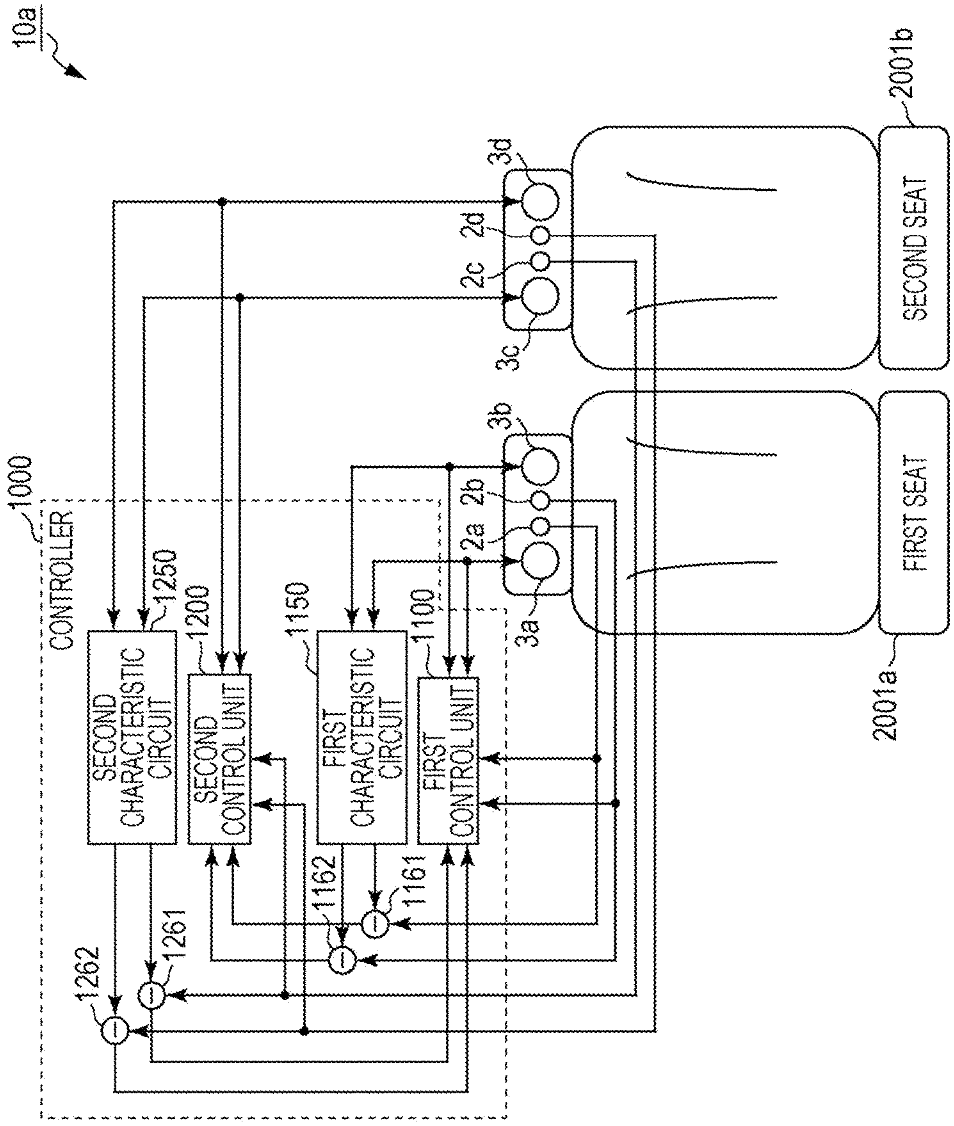
FIG. 12 is a diagram for explaining a structure of a noise controller, which uses no dedicated noise microphones.

Although Embodiment 1 described above uses the noise microphones 1*a* to 1*l* dedicated to the noise control, as illustrated in FIG. 12, only the error microphone of the different seat may be used as the noise microphone. FIG. 12 is a diagram for explaining a structure of a noise controller 10*a*, which uses no dedicated noise microphones.

Even with the structure like the noise controller 10*a* illustrated in FIG. 12, use of dedicated noise microphones is unnecessary as long as favorable noise reduction can be achieved. In this case, it is possible to further reduce parts including a microphone, a microphone amplifier, an LPF, and an AD converter, and downsizing and cost reduction can be further promoted.

Figure 13:
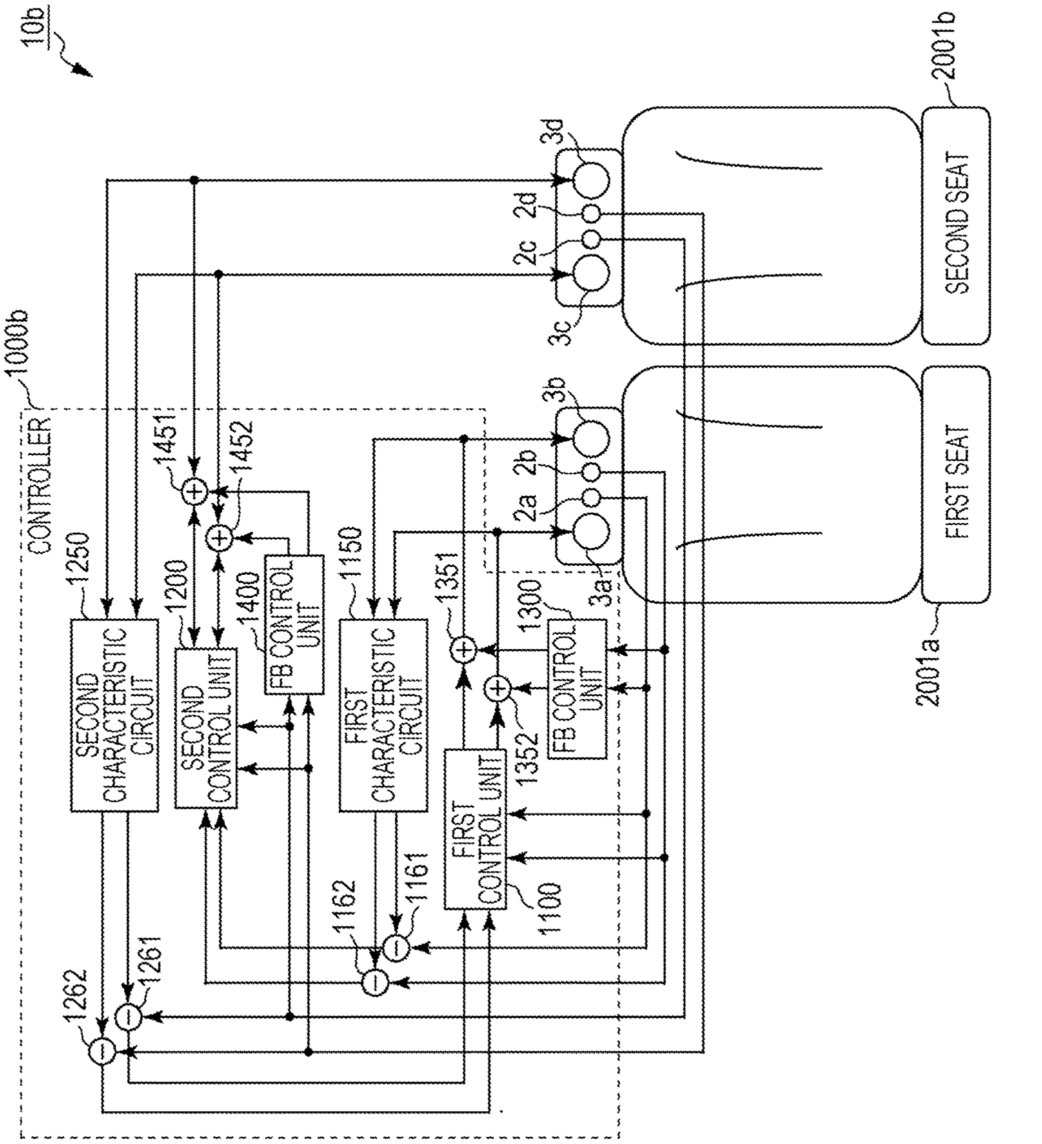
FIG. 13 illustrates a structure in which a feedback (FB) control unit is added to the noise controller in FIG. 12.

Moreover, so-called feedback (FB) control in which the error microphone of the controlled seat is used as the noise microphone of the controlled seat without using any dedicated noise microphone may be employed. FIG. 13 illustrates a structure in which an FB control unit 1300 is added to the noise controller 10*a* in FIG. 12.

The noise control at the first seat 2001*a* is described as an example. The error signals from the error microphones 2*a* and 2*b* of the first seat 2001*a* are input to the FB control unit 1300 as noise signals. The FB control unit 1300 performs a process of noise reduction as the FB control on the input error signals and outputs the resultant signals to adders 1351 and 1352.

The adders 1351 and 1352 add the output signals of the FB control unit 1300 and the first control unit 1100 and output the results of the addition to the speakers 3*a* and 3*b* as control signals.

Consequently, the noise controller 10*b* (a controller 1000*b*) can further enhance noise reduction effectiveness without newly adding a microphone, a microphone amplifier, an LPF, or an AD converter than the noise controller 10*a* illustrated in FIG. 12. Also at the second seat 2001*b*, an FB control unit 1400, and adders 1451 and 1452 enable similar control.

Although the noise controller 10*b* illustrated in FIG. 13 has a structure in which the FB control unit is added to the noise controller 10*a* illustrated in FIG. 12, the FB control unit may be added to the noise controller 10 illustrated in FIG. 6. In this case, since the dedicated noise microphones are also used in the control, the noise reduction effectiveness can be further promoted.

SUPPLEMENTARY EXPLANATION

In the above-described embodiment, the speakers and the error microphones are provided in the headrests of the seats for two reasons.

The first reason is described below.

In feed forward (FF) noise control, after noise is detected by a noise microphone, a signal process is performed in a controller and control sound is replayed from a speaker. The time taken for the control sound to reach the error microphone and the time taken for the noise at the position of the noise microphone to propagate in the vehicle interior and directly reach the error microphone need to be equal to each other and this is the condition to meet so-called causality.

To satisfy the condition, it is advantageous to make the distance from the speaker to the error microphone short. In particular, when as in the noise controller according to the above-described embodiment, the error microphone of adjacent seat is used as the noise microphone of the controlled seat, the noise at the position of the error microphone of the adjacent seat propagates to the error microphone of the controlled seat for a very short time. Thus, the distance from the speaker to the error microphone is desired to be short. Accordingly, a realistic structure that meets the causality includes placing the speakers and the error microphones at the headrests. This is the first reason.

The second reason is described below.

Since the position of the error microphone at the seat serves as the control point, the position of the error microphone is ideally near the ears of the occupant who is actually seated on the seat. However, since it is unable to place the error microphone near the ears of the occupant, the headrest close to the head of the occupant is a realistic arrangement location that enables sufficient noise reduction effectiveness to be obtained. This is the second reason.

Figure 14:
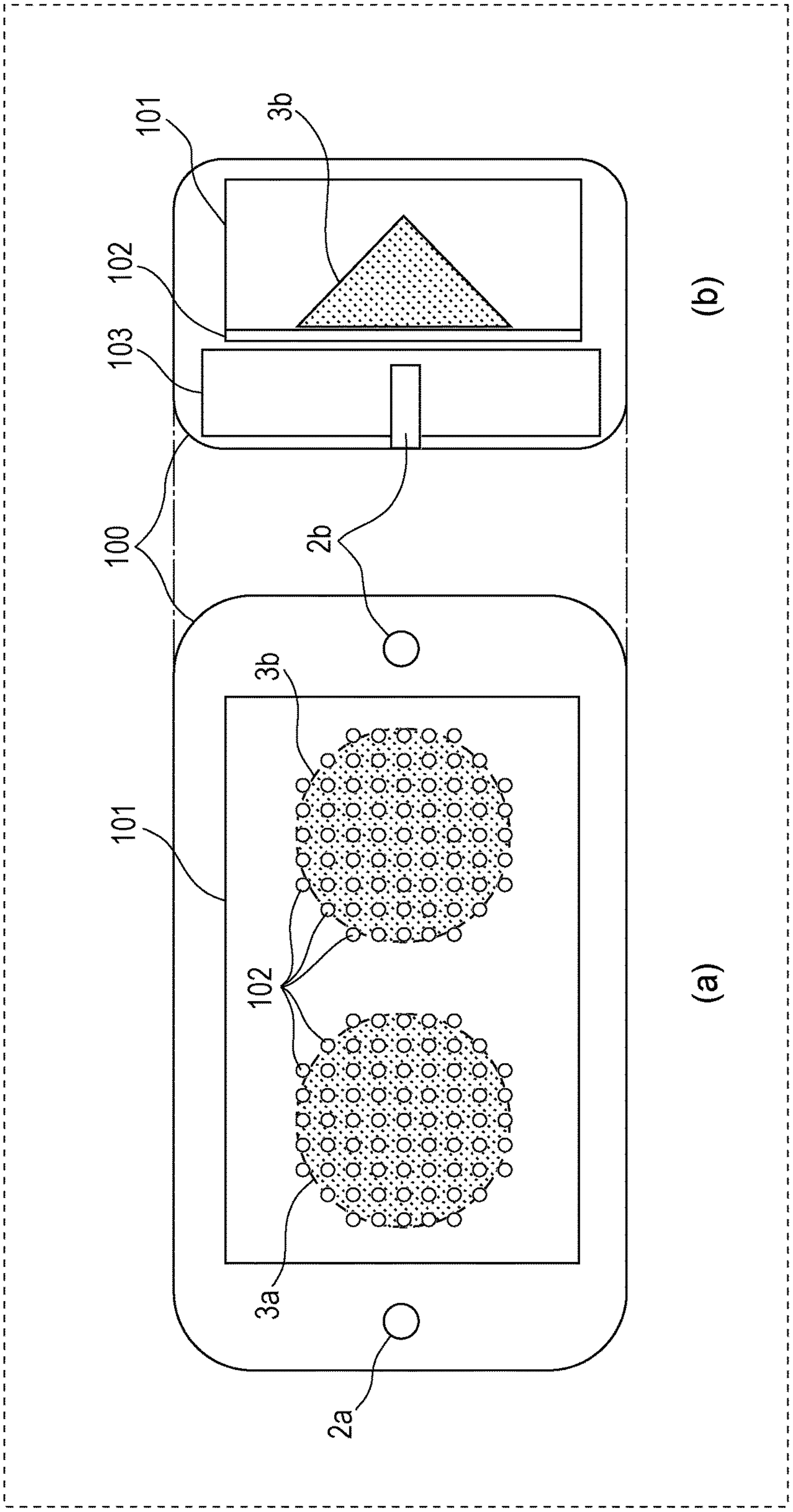
FIG. 14 illustrates an example of the positions at which the speakers and the error microphones are attached in a headrest.

A specific example of a structure in which the speakers and the error microphones are placed in a headrest is described with reference to FIG. 14. FIG. 14 illustrates an example of the positions at which the speakers and the error microphones are attached in a headrest 100. FIG. 14 illustrates an internal structure and specifically, FIG. 14(*a*) is a front view and FIG. 14(*b*) is a side view.

As illustrated in FIG. 14, a speaker box 101 shaped like a rectangular parallelepiped is provided inside the headrest 100. Urethane 103 is filled in the headrest 100.

The speakers 3*a* and 3*b* are installed in the speaker box 101 and punched metals 102 are provided on the front side of the speaker box 101.

The punched metal 102 is provided with a plurality of openings as illustrated in FIG. 14(*a*), and sound is emitted to the outside through the openings. The punched metals 102 are provided so that the urethane 103 does not come into direct contact with diaphragms of the speakers 3*a* and 3*b*.

If no punched metals 102 are provided, the control sound output from the speakers 3*a* and 3*b* may cause the diaphragms of the speakers 3*a* and 3*b* to touch the urethane 103 and distortion irrelevant to the control sound may occur, and thus, the punched metals 102 are used to prevent such distortion.

Besides, without the urethane 103, when the occupant sitting on the seat presses his or her head against the headrest 100, the head hits the speaker box 101 or the punched metals 102. As a result, displeasure is given to the occupant, such as hardness or pain. Worse yet, the vibrations of the speakers 3*a* and 3*b* at the time of replaying the control sound propagate to the head of the occupant and the displeasure may increase. The urethane 103 is filled so as to prevent such displeasure.

The surface of the headrest 100 is covered with cloth. The cloth is used mainly for the reason related to the design while serving to hold the inside of the headrest 100.

In the front view of the headrest 100, the error microphone 2*a* is provided in a left end portion and the error microphone 2*b* is provided in a right end portion. The error microphones 2*a* and 2*b* are provided so that the microphone sound holes are exposed through the cloth on the surface of the headrest 100.

Thus, the error microphones 2*a* and 2*b* can detect the noise outside the headrest 100, that is, the noise near the ears of the passenger sitting on the seat.

Flame-retardant materials are typically employed for the cloth on the surface of the headrest 100 and the urethane 103. Thus, the cloth on the surface of the headrest 100 and the urethane 103 block the inflow of air or make the inflow of air difficult. Accordingly, the control sound replayed from the speakers 3*a* and 3*b* passes through the passage-retardant materials and after that, is detected by the error microphones 2*a* and 2*b*.

Figure 15:
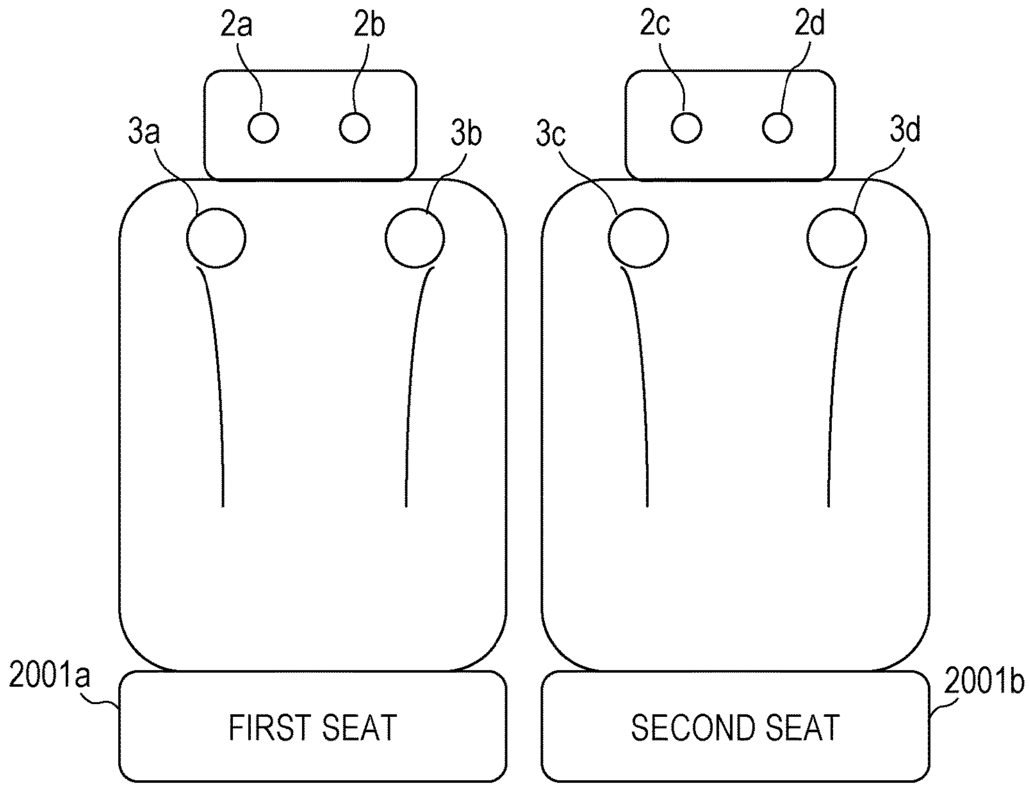
FIG. 15 is a first diagram illustrating an arrangement example of the speakers and the error microphones.

Although in FIG. 14, the speakers 3*a* and 3*b* and the error microphones 2*a* and 2*b* are provided in the headrest 100, it is also conceivable that the headrest 100 is not large enough to accommodate all of the speakers 3*a* and 3*b* and the error microphones 2*a* and 2*b*. In such a case, as illustrated in FIG. 15, the backrest units of the seats may be provided with the speakers 3*a* to 3*d*. FIG. 15 is a diagram illustrating an arrangement example of the speakers and the error microphones. Since, also in this case, the error microphones 2*a* to 2*d* are desirably positioned as near the ears of the occupants as possible, the error microphones 2*a* to 2*d* are desirably placed in the headrests.

Figure 16:
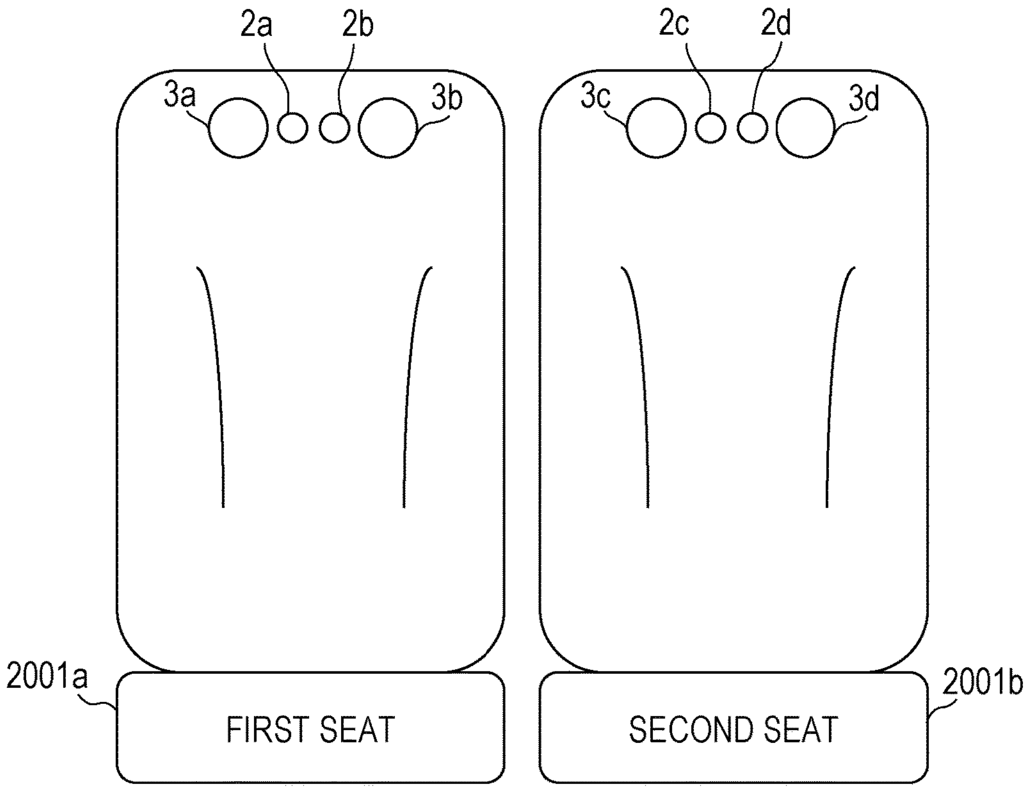
FIG. 16 is a second diagram illustrating an arrangement example of the speakers and the error microphones.
Figure 17:
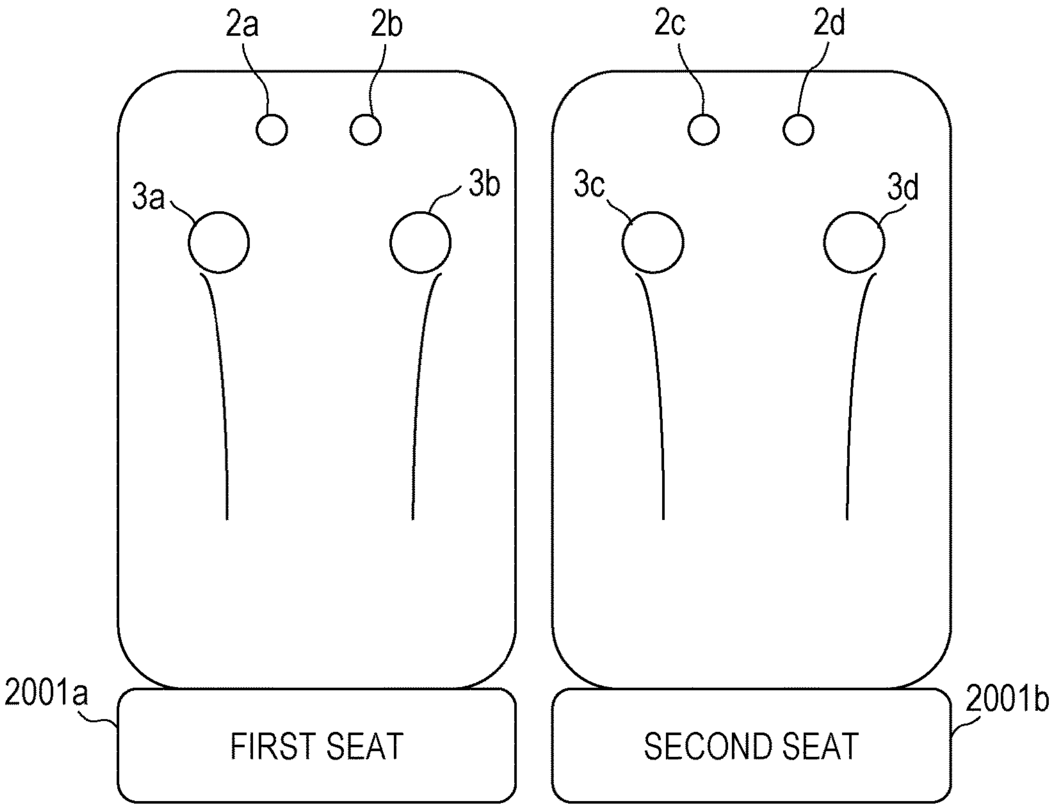
FIG. 17 is a third diagram illustrating an arrangement example of the speakers and the error microphones.

Moreover, it is also conceivable that the headrest and the backrest of the seat are not separated. Even in this case, as illustrated in FIGS. 16 and 17, the error microphones 2*a* to 2*d* are desirably provided near the ears of the occupants and also, the speakers 3*a* to 3*d* are desirably provided as near the heads of the occupants as possible in terms of the placement. FIGS. 16 and 17 are diagrams that illustrate arrangement examples of the speakers and the error microphones.

As long as the speakers and the error microphones can be placed near the head of the occupant, the speakers and the error microphones do not necessarily have to be provided at the seat. In particular, when applied to an automobile, the ceiling portion is near the head of the occupant and thus, the speakers and the error microphones may be provided in the ceiling portion. Since the ceiling portion enables use of a wide space, the ceiling portion is advantageous in ensuring the capacity of the speaker box and it is thus possible to expect enhancement of the replay ability of the speaker for the low frequencies needed in the noise control.

OTHER EMBODIMENTS

Although the noise controller according to Embodiment 1 is described above, the present disclosure is not limited to the above-described embodiment.

Although the above-described embodiment describes an example in which the noise controller is applied to an automobile, the noise controller according to the present disclosure may be applied to a train or an aircraft for example. Further, the noise controller according to the present disclosure is applicable to a space in which hearing positions are confined and reduction in the influence of extraneous noise is desired, such as a theater, a meeting room, or a home listening room, and the space to which the noise controller according to the present disclosure is applied is not particularly limited.

In particular, the number of seats in a train or an aircraft is larger than that in an automobile, and some of the seats in the train or the aircraft are positioned away from walls and windows, which are initial inflow routes of extraneous noise. Since the error signals at such distanced seats have low correlation with the noise signals of the noise microphones provided near the walls and the windows, favorable noise reduction effectiveness is difficult to be obtained according to the conventional noise control.

However, when as in the above-described embodiment, the error microphone of the seat near the controlled seat can be used as the noise microphone, the noise signals having high correlation with the error signals at the controlled seat can be used, and favorable noise reduction effectiveness can be obtained accordingly.

Although the above-described embodiment describes that the noise controller includes the error microphones, the noise microphones, and the speakers, it is no absolute must to include all of the constituent elements. That is, the noise controller may be implemented as an apparatus equivalent to the controller according to the above-described embodiment.

In each of the above-described embodiments, each constituent element may be configured with dedicated hardware or may be implemented by executing a software program suitable for each constituent element. Each constituent element may be implemented by a program execution unit, such as a central processing unit (CPU) or a processor, reading a software program recorded in a recording medium, such as a hard disk or semiconductor memory, and executing the software program.

The constituent elements may be circuits. Such circuits may make up a single circuit as a whole or may be separate circuits. Each of the circuits may be a general-purpose circuit or may be a dedicated circuit.

Although the noise controller according to one or more aspects based on the embodiments is described above, the present disclosure is not limited to the embodiments. As long as the spirit of the present disclosure is not departed, an embodiment in which each kind of variations that those skilled in the art can conceive is applied to the present embodiment or an embodiment obtained by combining constituent elements according to a different embodiment may also be included in the scope of the one or more aspects.

For example, the present disclosure may be implemented as a noise control method or as a mobile unit, such as an automobile, a train, or an aircraft, which includes the noise controller according to the above-described embodiment.

Further, for example, in each of the above-described embodiments, a process performed by a specific processing unit may be performed by another processing unit. The order of a plurality of processes may be changed or a plurality of processes may be performed in parallel.

The noise controller according to the present disclosure is useful as a noise controller that can reduce noise in an internal space of an automobile, an aircraft, or the like.

What is claimed is:

1. A noise controller for reducing noise at a first seat and noise at a second seat, the first seat including: (i) a first sound collector configured to collect noise at the first seat; and (ii) a first speaker configured to output a first sound for reducing the noise at the first seat, the second seat including: (i) a second sound collector configured to collect noise at the second seat; and (ii) a second speaker configured to output a second sound for reducing the noise at the second seat, the noise controller comprising:
- a processor; and
- non-transitory memory having stored therein instructions that when executed by the processor, cause the processor to perform operations,
- the operations including:
  - generating a first control signal causing the first sound and a second control signal causing the second sound;
  - outputting the first control signal to the first speaker, the first control signal causing the first speaker to output the first sound and the second control signal to the second speaker, the second control signal causing the second speaker to output the second sound;
  - convoluting a transfer characteristic from the second speaker to the second sound collector on the second control signal and generating a component of the second control signal based on a result of the convoluting; and
  - subtracting the component of the second control signal from an output signal of the second sound collector and generating a component of noise signal of the second sound collector based on a result of the subtracting,
  - wherein the generating comprises generating the first control signal by using the component of noise signal of the second sound collector and an output signal of the first sound collector, the first control signal minimizes the output signal of the first sound collector.

2. The noise controller according to claim 1, further comprising:
- a third sound collector configured to collect noise in a space including the first seat and the second seat is provided around the first seat and the second seat, and
- wherein the generating comprises generating the first control signal to be output to the first speaker to minimize the output signal of the first sound collector by referring to the component of noise signal of the second sound collector and an output signal from the third sound collector.

3. The noise controlling apparatus comprising:
- the first sound collector;
- the first speaker;
- the second sound collector;
- the second speaker; and
- the noise controller according to claim 1.

4. The noise controlling apparatus according to claim 3, wherein
- each of the first seat and the second seat includes a headrest,
- the first sound collector is provided in the headrest of the first seat, and
- the second sound collector is provided in the headrest of the second seat.

5. The noise controlling apparatus according to claim 4, wherein
- the first speaker is provided in the headrest of the first seat, and
- the second speaker is provided in the headrest of the second seat.

6. The noise controlling apparatus according to claim 3, wherein
- the first seat is a driving seat, and
- the second seat is a passenger seat neighboring the driving seat.

7. A noise control method for reducing noise at a first seat and noise at a second seat, the first seat includes (i) a first sound collector configured to collect noise at the first seat and (ii) a first speaker configured to output a first sound for reducing the noise at the first seat, the second seat includes (i) a second sound collector configured to collect noise at the second seat and (ii) a second speaker configured to output a second sound for reducing the noise at the second seat, the noise control method comprising:
- generating a first control signal causing the first sound and a second control signal causing the second sound;
- outputting the first control signal to the first speaker, the first control signal causing the first speaker to output the first sound and the second control signal to the second speaker, the second control signal causing the second speaker to output the second sound;
- convoluting a transfer characteristic from the second speaker to the second sound collector on the second control signal and generating a component of the second control signal based on a result of the convoluting; and
- subtracting the component of the second control signal from an output signal of the second sound collector and generating a component of noise signal of the second sound collector based on a result of the subtracting,
- wherein the generating comprises generating the first control signal by using the component of noise signal of the second sound collector and an output signal of the first sound collector, the first control signal minimizes the output signal of the first sound collector.

8. The noise controller according to claim 1, the operations further including:
- generating a first feedback resultant signal by using the output signal of the first sound collector;
- wherein the generating comprises generating the first control signal by using the component of noise signal of the second sound collector, an output signal of the first sound collector and the first feedback resultant signal, the first control signal minimizes the output signal of the first sound collector.

9. The noise controller according to claim 1,
- wherein the generating comprises updating a coefficient of an adaptive filter for the first control signal by using (i) the component of noise signal of the second collector as the input signal and (ii) the output signal of the first sound collector as the error signal, and the first control signal is generated by convoluting the updated coefficient of the adaptive filter with the output signal of the first sound collector.

10. The noise control method according to claim 6, further comprising:
- providing a third sound collector, configured to collect noise in a space including the first seat and the second seat, around the first seat and the second seat, and
- wherein the generating comprises generating the first control signal to be output to the first speaker to minimize the output signal of the first sound collector by referring to the component of noise signal of the second sound collector and an output signal from the third sound collector.

11. The noise control method according to claim 7, further comprising:

providing a first feedback resultant signal by using the output signal of the first sound collector;

wherein the generating comprises generating the first control signal by using the component of noise signal of the second sound collector, an output signal of the first sound collector and the first feedback resultant signal, the first control signal minimizes the output signal of the first sound collector.

12. The noise control method according to claim 7, wherein the generating comprises updating a coefficient of an adaptive filter for the first control signal by using (i) the component of noise signal of the second collector as the input signal and (ii) the output signal of the first sound collector as the error signal, and the first control signal is generated by convoluting the updated coefficient of the adaptive filter with the output signal of the first sound collector.

* * * * *